(12) United States Patent
Huang

(10) Patent No.: US 10,943,978 B2
(45) Date of Patent: Mar. 9, 2021

(54) HIGH VOLTAGE DEVICE AND MANUFACTURING METHOD THEREOF

(71) Applicant: RICHTEK TECHNOLOGY CORPORATION, Zhubei (TW)

(72) Inventor: Tsung-Yi Huang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 46 days.

(21) Appl. No.: 16/354,140

(22) Filed: Mar. 14, 2019

(65) Prior Publication Data
US 2020/0006490 A1 Jan. 2, 2020

(30) Foreign Application Priority Data

Jun. 28, 2018 (TW) .................... 107122345

(51) Int. Cl.
*H01L 29/78* (2006.01)
*H01L 29/10* (2006.01)
*H01L 29/66* (2006.01)
*H01L 29/40* (2006.01)
*H01L 21/74* (2006.01)

(52) U.S. Cl.
CPC ........ *H01L 29/1087* (2013.01); *H01L 21/743* (2013.01); *H01L 29/1095* (2013.01); *H01L 29/408* (2013.01); *H01L 29/66681* (2013.01); *H01L 29/7816* (2013.01)

(58) Field of Classification Search
CPC ............. H01L 29/0852; H01L 29/1095; H01L 29/086; H01L 29/0865; H01L 29/0878; H01L 29/0882; H01L 29/7816; H01L 29/66681
See application file for complete search history.

(56) References Cited

U.S. PATENT DOCUMENTS

| | | | | | |
|---|---|---|---|---|---|
| 4,831,423 A | * | 5/1989 | Shannon | ............. | H01L 29/0619 257/141 |
| 5,243,234 A | * | 9/1993 | Lin | ....................... | H01L 29/402 327/427 |
| 6,724,043 B1 | * | 4/2004 | Ekkanath Madathil | ..................... | H01L 29/749 257/133 |
| 2002/0045301 A1 | * | 4/2002 | Sicard | ................. | H01L 27/0266 438/197 |
| 2004/0084744 A1 | * | 5/2004 | Khemka | ............. | H01L 29/7816 257/492 |
| 2006/0267044 A1 | * | 11/2006 | Yang | .................... | H01L 29/7816 257/141 |
| 2013/0270635 A1 | * | 10/2013 | Parris | .................. | H01L 29/0847 257/336 |
| 2015/0200309 A1 | * | 7/2015 | Karino | ............... | H01L 27/0248 257/272 |
| 2017/0062406 A1 | * | 3/2017 | Ko | ..................... | H01L 29/7412 |

(Continued)

*Primary Examiner* — Michele Fan
(74) *Attorney, Agent, or Firm* — Tung & Associates

(57) ABSTRACT

An N-type high voltage device includes: a semiconductor layer, a well region, a floating region, a bias region, a body region, a body contact, a gate, a source and a drain. The floating region and the bias region both have P-type conductivity, and both are formed in a drift region in the well region. The bias region is electrically connected with a predetermined bias voltage, and the floating region is electrically floating, to increase a breakdown voltage of the high voltage device and to suppress turning-ON a parasitic transistor in the high voltage device.

16 Claims, 9 Drawing Sheets

(56) References Cited

U.S. PATENT DOCUMENTS

2017/0125584 A1* 5/2017 Zhang ................ H01L 29/0619
2017/0250259 A1* 8/2017 Mori ................... H01L 29/1083

* cited by examiner

HIGH VOLTAGE DEVICE AND MANUFACTURING METHOD THEREOF

CROSS REFERENCES

The present invention claims priority to TW 107122345 filed on Jun. 28, 2018.

BACKGROUND OF THE INVENTION

Field Invention

The present invention relates to a high voltage device and a manufacturing method thereof; particularly, it relates to a high voltage device having a high breakdown voltage and capable of suppressing turning-ON a parasitic transistor therein, and a manufacturing method thereof.

Description of Related Art

FIGS. 1A and 1B respectively show a top view and a cross-section view, of a conventional high voltage device 100. A high voltage device, in the context of this invention, refers to a device whose drain is capable of withstanding a voltage which is higher than 5V during normal operation. In general, the drain 19 and the gate 17 of the high voltage device 100 are separated by a drift region 12a in between (as indicated by the dashed line of FIG. 1B), the drift region 12a serving as a drift current channel of the high voltage device 100 during ON operation, and the lateral length of the drift region 12a in a channel direction (as indicated by the direction of the dashed arrow in FIGS. 1A and 1B) is determined according to the voltage that the high voltage device 100 is required to withstand in normal operation. As shown in FIGS. 1A and 1B, the high voltage device 100 includes a well region 12, an isolation structure 13, a drift oxide region 14, a body region 16, a body electrode 16', a gate 17, a source 18, and a drain 19. The well region 12 which is N-type is formed on the substrate 11, and the isolation structure 13 is a local oxidation of silicon (LOCOS) structure to define an operation region 13a as a main operation region when the high voltage device 100 operates. The range of the operation region 13a is indicated by the thick dashed line frame in FIG. 1A. The gate 17 covers a part of the drift oxide region 14. When the high voltage device 100 operates, hot carriers in the form of electron holes generated by the high electric field are injected into the body electrode 16' via the body region 16, and the current caused by the hot carriers will raise a voltage between the body region 16 and the source 18, which will turn ON a parasitic transistor formed by the body region 16, the source 18 and the well region 12; in other words, the safe operation area (SOA) of the high voltage device 100 is limited. ("SOA" is known to a person having ordinary skill in the art, so the details thereof are not redundantly explained here.) In addition, the capacitance caused by the PN junction between the body region 16 and the well region 12 is too large, so that in transient response during operation of the high voltage device 100, a displacement current is generated between the source 18 and the body region 16, which also can turn on the parasitic transistor. In addition, a high electric field is formed in the drift region 12a during OFF operation of the high voltage device 100, which limits the breakdown voltage of the high voltage device 100. The above demerits limit the performance of the high voltage device 100.

In view of the above, the present invention provides a high voltage device and a manufacturing method thereof, wherein the high voltage device is not only capable of suppressing turning-ON a parasitic transistor during ON operation but also capable increasing a breakdown voltage during OFF operation, to increase the SOA and the application range of the device.

SUMMARY OF THE INVENTION

From one perspective, the present invention provides a high voltage device comprising: a semiconductor layer formed on a substrate, wherein the semiconductor layer has a top surface and a bottom surface opposite to the top surface in a vertical direction; a well region having a first conductivity, wherein the well region is formed beneath the top surface and in contact with the top surface; a floating region having a second conductivity, wherein the floating region is formed in the well region, beneath the top surface and in contact within the top surface, the floating region having a first impurity concentration; a bias region having the second conductivity, wherein the bias region is formed in the well region, beneath the top surface and in contact with the top surface, the floating region having a second impurity concentration; a body region having the second conductivity, wherein the body region is formed beneath and in contact with the top surface and contacts the well region in a channel direction, the body region having a third impurity concentration, wherein the third impurity concentration is higher than the first impurity concentration and the second impurity concentration; a body electrode having the second conductivity, wherein the body electrode is formed in the body region, beneath the top surface and in contact with the top surface, to serve as an electrical contact of the body region; a gate formed on the top substrate, wherein a portion of the body region is located below the gate and in contact with the gate, to provide an inversion region of the high voltage device during ON operation of the high voltage device; and a source and a drain having the first conductivity, the source and the drain being formed beneath the top surface and in contact with the top surface in the vertical direction, wherein the source and the drain are respectively located at two lateral sides of the gate, the source being located in the body region, and the drain being located in the well region and away from the body region; wherein a portion of the well region between the body region and the drain serves as a drift region during ON operation of the high voltage device; wherein the floating region and the bias region are both in the drift region; wherein the bias region is electrically connected with a predetermined bias voltage and the floating region is electrically floating.

From another perspective, the present invention provides a manufacturing method of a high voltage device, comprising: forming a semiconductor layer on a substrate, wherein the semiconductor layer has a top surface and a bottom surface opposite to the top surface in a vertical direction; forming a well region having a first conductivity, wherein the well region is formed beneath the top surface and in contact with the top surface; forming a floating region having a second conductivity, wherein the floating region is formed in the well region, beneath the top surface and in contact with in the top surface, the floating region having a first impurity concentration; forming a bias region having the second conductivity, wherein the bias region is formed in the well region, beneath the top surface and in contact with the top surface, the floating region having a second impurity concentration; forming a body region having the second conductivity, wherein the body region is formed beneath and in contact with the top surface and contacts the well region in a channel direction, the body region having a third impurity concentration, wherein the third impurity concentration is higher than the first impurity concentration and the second impurity concentration; forming a body electrode having the second conductivity, wherein the body electrode is formed in the body region, beneath the top surface and in contact with the top surface, to serve as an electrical contact of the body region; forming a gate formed on the top substrate, wherein a portion of the body region is located below the gate and in contact with the gate, to provide an inversion region of the high voltage device during ON operation of the high voltage device; and forming a source and a drain having the first conductivity, the source and the drain being formed beneath the top surface and in contact with the top surface in the vertical direction, wherein the source and the drain are respectively located at two lateral sides of the gate, the source being located in the body region, and the drain being located in the well region and away from the body region; wherein a portion of the well region between the body region and the drain serves as a drift region during ON operation of the high voltage device; wherein the floating region and the bias region are both in the drift region; wherein the bias region is electrically connected with a predetermined bias voltage and the floating region is electrically floating.

In one preferable embodiment, the high voltage device further includes: a drift oxide region formed on the top surface and in contact with a portion of the drift region, wherein the floating region and the bias region are located below the drift oxide region and in contact with the drift oxide region.

In one preferable embodiment, the drift oxide region includes a local oxidation of silicon (LOCOS) structure, a shallow trench isolation (STI) structure or a chemical vapor deposition (CVD) oxide structure.

In one preferable embodiment, the high voltage device further includes a conductive plug which is electrically connected with the bias region by penetrating through the drift oxide region in the vertical direction, to serve as an electrical contact of the bias region.

In one preferable embodiment, a portion of the gate is located on the floating region or on the bias region.

In one preferable embodiment, the bias region is electrically connected to the body electrode.

In one preferable embodiment, the floating region and the bias region are not in contact with each other, and the floating region and the bias region are separated by the well region in the channel direction.

In one preferable embodiment, the high voltage device further includes a buried layer having the first conductivity, wherein the buried layer is formed beneath the body region and in contact with the body region and the buried layer completely covers a lower boundary of the body region.

The objectives, technical details, features, and effects of the present invention will be better understood with regard to the detailed description of the embodiments below.

DESCRIPTION OF THE PREFERABLE EMBODIMENTS

The drawings as referred to throughout the description of the present invention are for illustration only, to show the interrelations among the process steps and the layers, but the shapes, thicknesses, and widths are not drawn in actual scale.

Figure 1A:
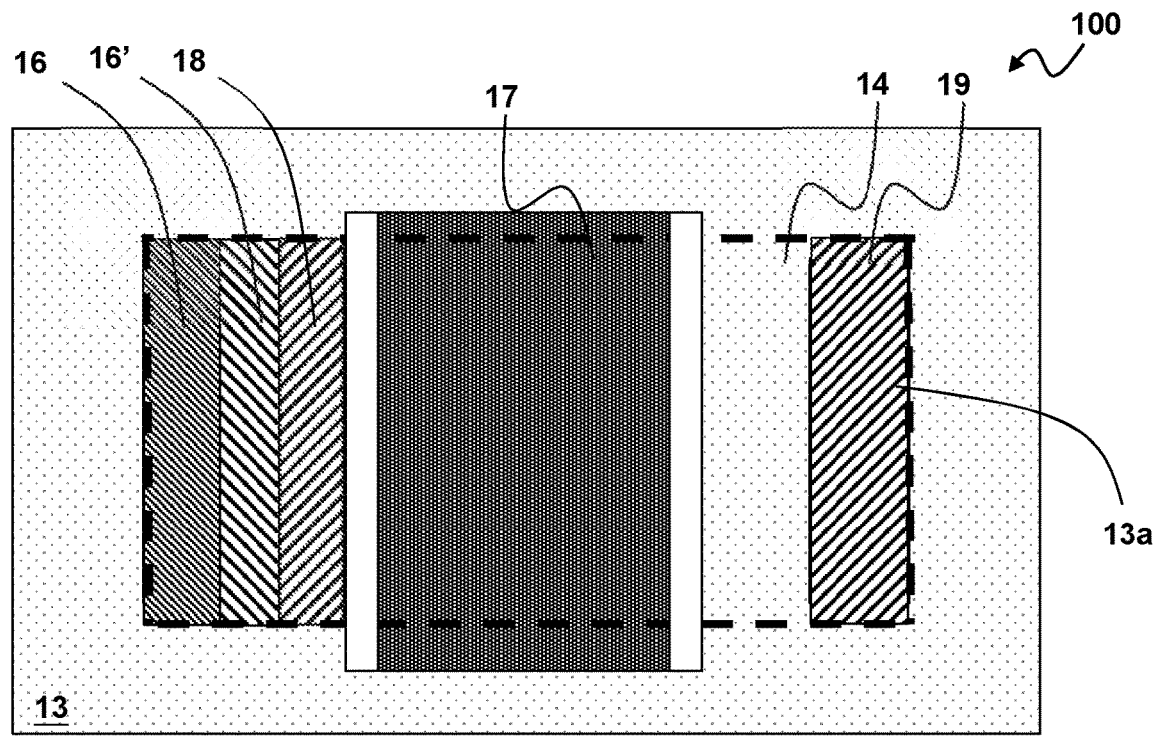
FIGS. 1A and 1B show a top view and a cross-section view of a conventional high voltage device 100, respectively.
Figure 1B:
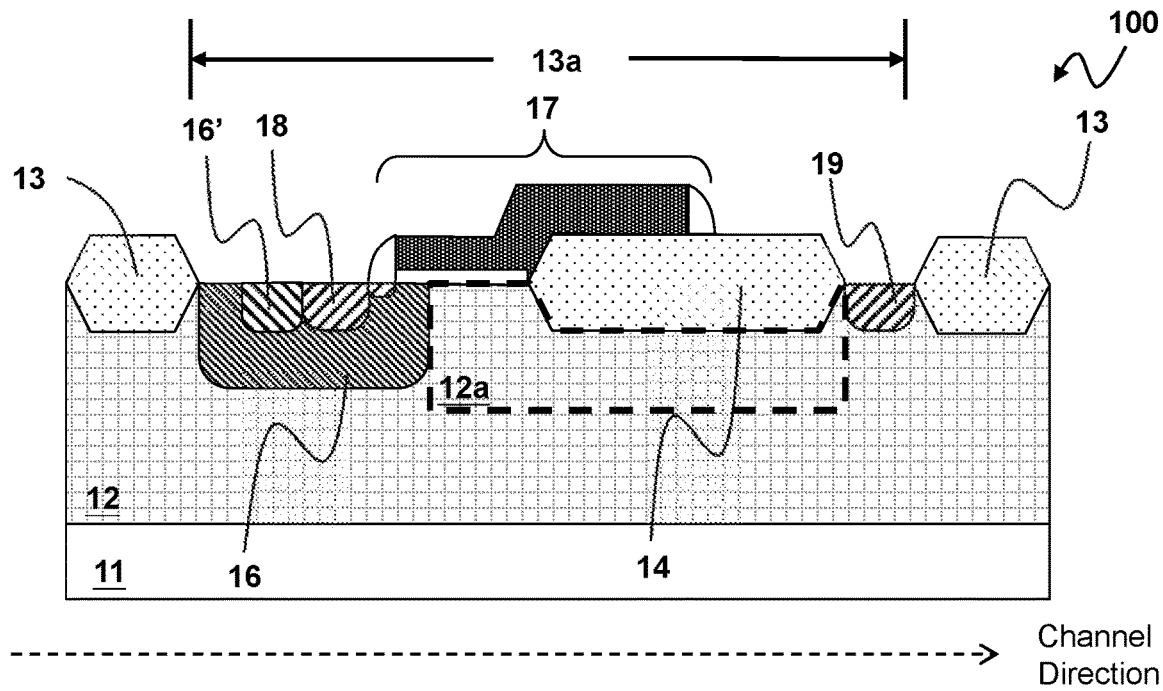
Figure 2:
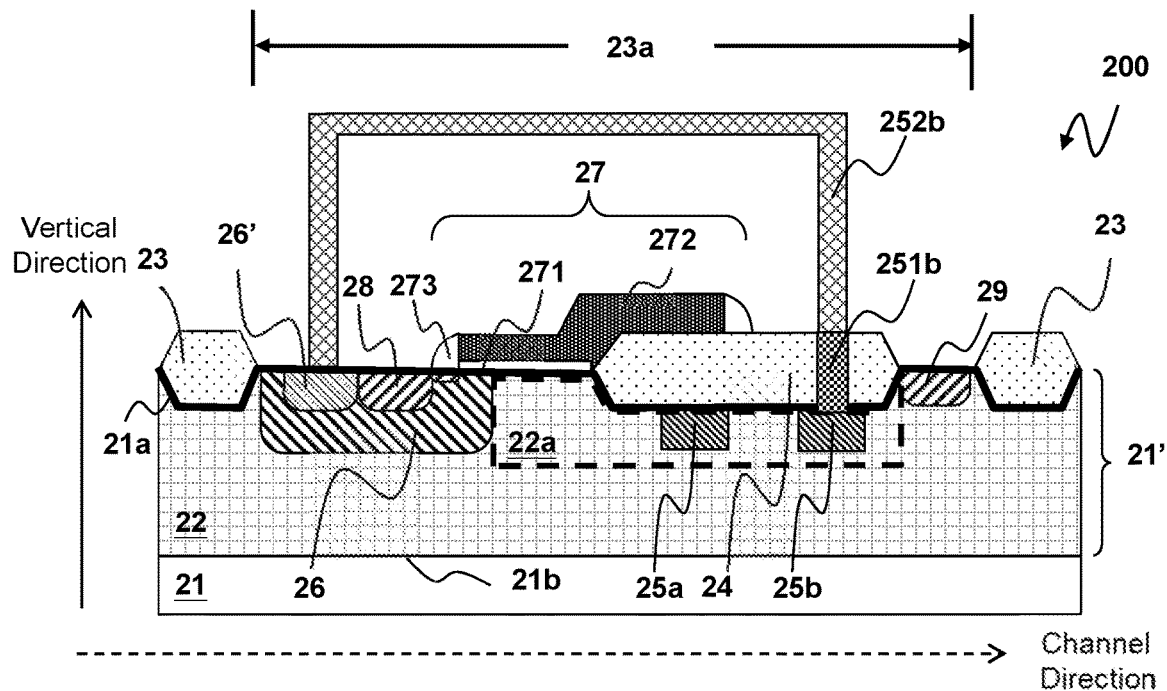
FIG. 2 shows a first embodiment of the present invention.

Please refer to FIG. 2, which shows a first embodiment of the present invention. FIG. 2 shows a cross-section view of a high voltage device 200. As show in FIG. 2, the high voltage device 200 includes a semiconductor layer 21', a well region 22, an isolation structure 23, a drift oxide region 24, a floating region 25a, a bias region 25b, a body region 26, a body electrode 26', a gate 27, a source 28 and a drain 29. The semiconductor layer 21' which is formed on the substrate has a top surface 21a and a bottom surface 21b opposite to the top surface 21a in a vertical direction (as indicated by the direction of the solid arrow in FIG. 2). The substrate 21 is, for example but not limited to, a second or N-type semiconductor silicon substrate. The semiconductor layer 21', for example, is formed on the substrate 21 by epitaxy, or a part of the substrate 21 is used to form the semiconductor layer 21'. The semiconductor layer 21' can be formed by various methods known to a person having ordinary skill in the art, so the details thereof are not redundantly explained here.

Still referring to FIG. 2, the isolation structure 23 is formed on and in contact with the top surface 21a for defining an operation region 23a. The isolation structure 23 is not limited to a local oxidation of silicon (LOCOS) structure as shown in the figure, and may be a shallow trench isolation (STI) structure or a chemical vapor deposition (CVD) oxide structure. The drift oxide region 24 is formed on and in contact with the top surface 21a and is located on a part of the drift region 22a (as indicated by the dashed line frame in FIG. 2) in the operation region 23a. The drift oxide region 24 can be formed, for example, by the same process steps for forming the isolation structure 23, so that the drift oxide region 24 and the isolation structure 23 are formed at the same time. As show in the figure, the floating region 25a and the bias region 25b are located below the drift oxide region 24 and contact the drift oxide region 24.

The well region 22 which has N-type conductivity is formed in the operation region 23a of the semiconductor layer 21', and the well region 22 is located beneath the top surface 21a and in contact with the top surface 21a in the vertical direction. The floating region 25a which has P-type conductivity is formed in the well region 22, beneath the top surface 21a and in contact with the top surface 21a. The floating region 25a has a first impurity concentration. The first impurity concentration refers to the net a second impurity concentration in the floating region 25a, that is, the total concentration of the second impurities minus the total concentration of the first impurities (the concentrations of other regions are calculated in the same way). The bias region 25b which has P-type conductivity is formed in the well region 22, beneath the top surface 21a and in contact with the top surface 21a and the bias region 25b has a second impurity concentration. The floating region 25a and the bias region 25b are both located in the drift region 22a. The bias region 25b is electrically connected to a predetermined bias voltage, for example but not limited to, electrically connected to the body electrode 26', and the floating region 25a is electrically floating. In a preferable embodiment, the high voltage device 200 further includes a conductive plug 251b and a wire 252b. The conductive plug 251b is electrically connected to the bias region 25b, by penetrating through the drift oxide region 24, to serve as an electrical contact of the bias region 25b. The conductive plug 251b is electrically connected with the body electrode 26' via the wire 252b so that the bias region 25b is electrically connected to the body electrode 26'.

The body region 26 which has P-type conductivity is formed in the well region 22 in the operation region 23a. The body region 26 is located beneath the top surface 21a and in contact with the top surface 21a in the vertical direction. The body region 26 contacts the well region 22 in the channel direction (as indicated by the dashed arrow in the figure) and the body region 26 has a third impurity concentration, wherein the third impurity concentration is higher than the first impurity concentration and the second impurity concentration. The body electrode 26' which has P-type conductivity serves as an electrical contact of the body region 26, and the body electrode 26' is formed in the body region 26, beneath the top surface 21a and in contact with the top surface 21a in the vertical direction. The gate 27 is formed on the top surface 21a in the operation region 23a of the semiconductor layer 21', wherein a portion of the body region 26 is located below the gate 27 and in contact with the gate 27 to provide an inversion region of the high voltage device 200 during ON operation.

Still referring to FIG. 2, the source 28 and the drain 29 have a first conductivity. The source 28 and the drain 29 are formed in the operation region 23a, beneath the top surface 21a and in contact with the top surface 21a in the vertical direction. The source 28 and the drain 29 are respectively located at two lateral sides of the gate 27, wherein the source 28 is located in the body region 26, and the drain 29 is located in the well region 22 and away from the body region 26. In the channel direction, the drift region 22a is located between the drain 29 and the body region 26, in the well region 22 near the top surface 21a, to serve as a drift current channel of the high voltage device 200 during ON operation. In a preferable embodiment, as shown in FIG. 2, the floating region 25a and the bias region 25b are not in contact with each other, and the floating region 25a and the bias region 25b are separated by the well region 22 in the channel direction.

Note that the term "inverse current channel" means thus. Taking this embodiment as an example, when the high voltage device 200 operates in ON operation due to the voltage applied to the gate 27, an inversion layer is formed beneath the gate 27 so that a conduction current flows through the region of the inversion layer, which is the inverse current channel known to a person having ordinary skill in the art.

Note that the term "drift current channel" means thus. Taking this embodiment as an example, the drift region refers to a region where the conduction current passes through in a drifting manner when the high-voltage device 200 operates in ON operation, which is known to a person having ordinary skill in the art.

Note that the top surface 21a as referred to does not mean a completely flat plane but refers to the surface of the semiconductor layer 21', as indicated by a thick line in FIG. 2. In the present embodiment, for example, a part of the top surface 21a where the drift oxide region 24 is in contact with has a recessed portion.

Note that the gate 27 as defined in the context of this invention includes a gate dielectric layer 271 in contact with the top surface 21a, a gate conductive layer 272 which is conductive, and a gate spacer layer 273 which is electrically insulative, and this is known to a person having ordinary skill in the art, so the details thereof are not redundantly explained here.

In addition, the term "high voltage" device means that, when the device operates in normal operation, the voltage applied to the drain is higher than a specific voltage, such as 5V; for devices of different high voltages, a lateral distance (distance of the drift region 22a) between the body region 26 and the drain 29 can be determined according to the operation voltage that the device is designed to withstand during normal operation, which is known to a person having ordinary skill in the art.

The present invention is superior to the prior art in that: taking the embodiment shown in FIG. 2 an example, according to the present invention, when the high voltage device 200 operates, the hot carriers generated by the high electric field (for example but not limited to, the holes in the first high voltage device 200), are absorbed by the hot carrier absorption channel provided by the bias region 25b to suppress turning-ON the parasitic transistor formed by the body region 26, the source 28, and the well region 22. The current formed by the aforementioned hot carrier effect is reduced or is not generated due to the hot carrier absorption channel provided by the bias region 25b, thereby increasing the range of the safe operation area (SOA) and improving the performance of the high voltage device 200. In one preferable embodiment, the bias region 25b is electrically connected with the body electrode 26' such that the high voltage device 200 can provide the aforementioned hot carrier absorption channel regardless of whether the high voltage device 200 is used as an upper bridge device or a lower bridge device of a power conversion circuit. In addition, when the high voltage device 200 is in OFF operation, the depletion region between the second floating region 25a and the well region 22 can reduce the high electric field in the well region 22, so as to improve the breaken voltage of the high voltage device 200 during OFF operation, which further improves the performance of the high voltage device 200.

Figure 3:
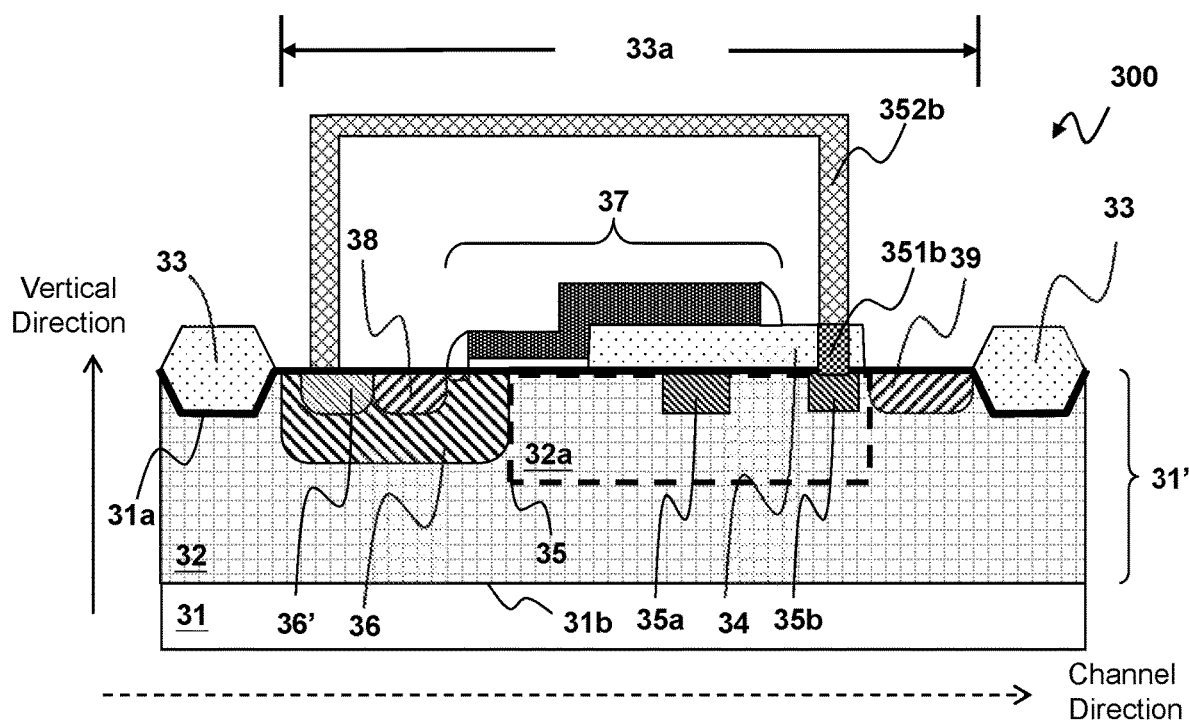
FIG. 3 shows a second embodiment of the present invention.

Please refer to FIG. 3, which shows a second embodiment of the present invention. FIG. 3 shows a cross-section view of a high voltage device 300. As show in FIG. 3, the high voltage device 300 includes a semiconductor layer layer 31', a well region 32, an isolation structure 33, a drift oxide region 34, a floating region 35a, a bias region 35b, a body region 36, a body electrode 36', a gate 37, a source 38 and a drain 39. The semiconductor layer 31' which is formed on the substrate has a top surface 31a and a bottom surface 31b opposite to the top surface 31a in the vertical direction (as indicated by the direction of the solid arrow in FIG. 3). The substrate 31 is, for example but not limited to, a P-type or N-type semiconductor silicon substrate. The semiconductor layer 31', for example, is formed on the substrate 31 by epitaxy, or a part of the substrate 31 is used to form the semiconductor layer 31'. The semiconductor layer 31' can be formed by various methods known to a person having ordinary skill in the art, so the details thereof are not redundantly explained here.

Still referring to FIG. 3, the isolation structure 33 is formed on and in contact with the top surface 31a, for defining an operation region 33a. The isolation structure 33 is not limited to a local oxidation of silicon (LOCOS) structure as shown in FIG. 3, and may be a shallow trench isolation (STI) structure or a chemical vapor deposition (CVD) oxide structure. The drift oxide region 34 is formed on and in contact with the top surface 31a, and is located on a portion of the drift region 32a (as indicated by the dashed line frame in FIG. 3) in the operation region 33a. In this embodiment, the drift oxide region 44 is a CVD oxide structure and the isolation structure 43 is a LOCOS structure. In another embodiment, both the drift oxide region 44 and the isolation structure 43 are CVD oxide structures, and in this case the drift oxide region 44 can be formed by the same process steps for forming the isolation structure 43, such that they are formed at the same time. As show in the figure, the floating region 35a and the bias region 35b are located below the drift oxide region 34 and contact the drift oxide region 34.

The well region 32 which has N-type conductivity is formed in the operation region 33a of the semiconductor layer 31', and the well region 32 is located beneath the top surface 31a and in contact with the top surface 31a in the vertical direction. The floating region 35a which has P-type conductivity is formed in the well region 32, beneath the top surface 31a and in contact with the top surface 31a. The floating region 35a has a first impurity concentration. The first impurity concentration refers to the net a second impurity concentration in the floating region 35a, that is, the total concentration of the second impurities minus the total concentration of the first impurities (the concentrations of other regions are calculated in the same way). The bias region 35b which has P-type conductivity is formed in the well region 32, beneath the top surface 31a and in contact with the top surface 31a, and the bias region 35b has a second impurity concentration. The floating region 35a and the bias region 35b are both located in the drift region 32a. The bias region 35b is electrically connected to a predetermined bias voltage, for example but not limited to, electrically connected to the body electrode 36', and the floating region 35a is electrically floating. In a preferable embodiment, the high voltage device 300 further includes a conductive plug 351b and a wire 352b. The conductive plug 351b is electrically connected to the bias region 35b, by penetrating through the drift oxide region 34, to serve as an electrical contact of the bias region 35b. The conductive plug 351b is electrically connected with the body electrode 36' via the wire 352b so that the bias region 35b is electrically connected to the body electrode 36'.

The body region 36 which has P-type conductivity is formed in the well region 32 in the operation region 33a. The body region 36 is located beneath the top surface 31a and in contact with the top surface 31a in the vertical direction. The body region 36 contacts the well region 32 in the channel direction (as indicated by the dashed arrow in the figure) and the body region 36 has a third impurity concentration, wherein the third impurity concentration is higher than the first impurity concentration and the second impurity concentration. The body electrode 36' which has P-type conductivity serves as an electrical contact of the body region 36, and the body electrode 36' is formed in the body region 36, beneath the top surface 31a and in contact with the top surface 31a in the vertical direction. The gate 37 is formed on the top surface 31a in the operation region 33a of the semiconductor layer 31', wherein a portion of the body region 36 is located below the gate 37 and in contact with the gate 37 to provide an inversion region of the high voltage device 300 during ON operation.

Still referring to FIG. 3, the source 38 and the drain 39 have N-type conductivity. The source 38 and the drain 39 are formed in the operation region 33a, beneath the top surface 31a and in contact with the top surface 31a in the vertical direction. The source 38 and the drain 39 are respectively located at two lateral sides of the gate 37, wherein the source 38 is located in the body region 36, and the drain 39 is located in the well region 32 and away from the body region 36. In the channel direction, the drift region 32a is located between the drain 39 and the body region 36, in the well region 32 near the top surface 31a, to serve as a drift current channel of the high voltage device 300 during ON operation. In a preferable embodiment, as shown in FIG. 3, the floating region 35a and the bias region 35b are not in contact with each other, and the floating region 35a and the bias region 35b are separated by the well region 32 in the channel direction.

This embodiment differs from the first embodiment in that, in the first embodiment, the drift oxide well 24 is a LOCOS structure, while in the present embodiment, the drift oxide well 34 is a CVD oxide structure. The CVD oxide structure is formed by a CVD process, which is known to a person having ordinary skill in the art, so the details thereof are not redundantly explained here.

Figure 4:
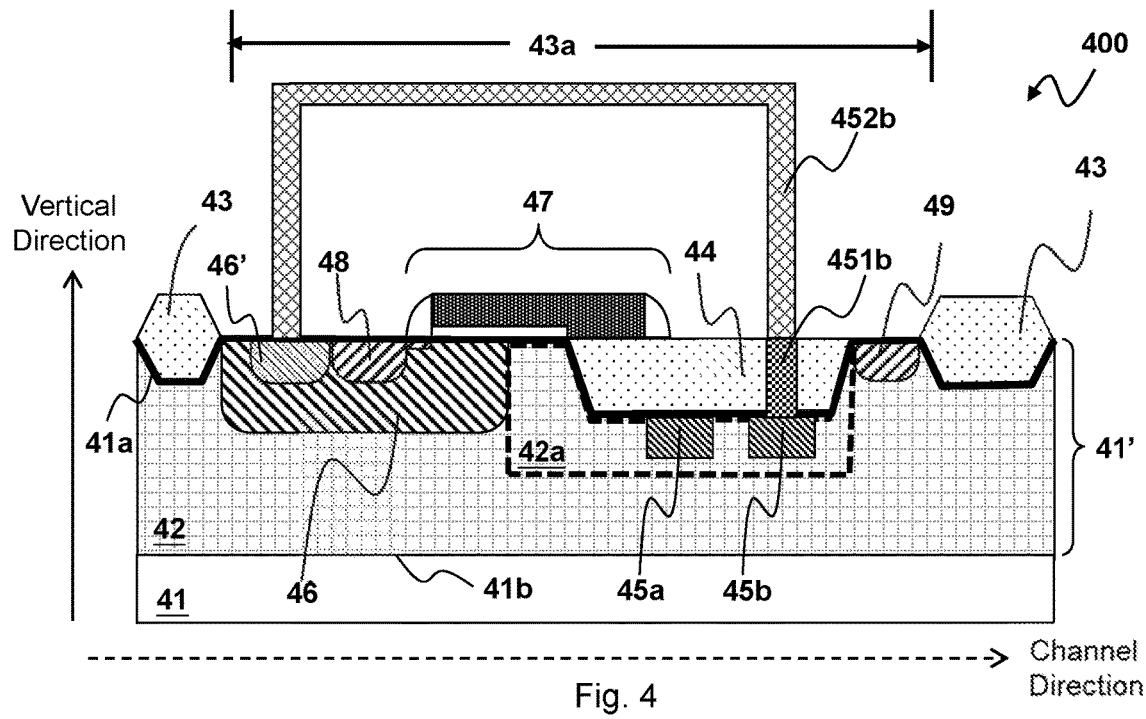
FIG. 4 shows a third embodiment of the present invention.

Please refer to FIG. 4, which shows a third embodiment of the present invention. FIG. 4 shows a cross-section view of a high voltage device 400. As show in FIG. 4, the high voltage device 400 includes a semiconductor layer layer 41', a well region 42, an isolation structure 43, a drift oxide region 44, a floating region 45a, a bias region 45b, a body region 46, a body electrode 46', a gate 47, a source 48 and a drain 49. The semiconductor layer 41' which is formed on the substrate 41 has a top surface 41a and a bottom surface 41b opposite to the top surface 41a in the vertical direction (as indicated by the direction of the solid arrow in FIG. 4). The substrate 41 is, for example but not limited to, a P-type or N-type semiconductor silicon substrate. The semiconductor layer 41', for example, is formed on the substrate 41 by epitaxy, or a part of the substrate 41 is used to form the semiconductor layer 41'. The semiconductor layer 41' can be formed by various methods known to a person having ordinary skill in the art, so the details thereof are not redundantly explained here.

Still referring to FIG. 4, the isolation structure 43 is formed on the top surface 41a and in contact with the top surface 41a for defining an operation region 43a. The isolation structure 43 is not limited to a local oxidation of silicon (LOCOS) structure as shown in FIG. 4, and may be a shallow trench isolation (STI) structure or a chemical vapor deposition (CVD) oxide structure. The drift oxide region 44 is formed on and in contact with the top surface 41a, and is located on a part of the drift region 42a (as indicated by the dashed line frame in FIG. 4) in the operation region 43a. In this embodiment, the drift oxide region 44 is an STI structure and the isolation structure 43 is a LOCOS structure. In another embodiment, both the drift oxide region 44 and the isolation structure 43 are STI structures, and in this case the drift oxide region 44 can be formed by the same process steps for forming the isolation structure 43, such that they are formed at the same time. As show in the figure, the floating region 45a and the bias region 45b are located below the drift oxide region 44 and contact the drift oxide region 44.

The well region 42 which has N-type conductivity is formed in the operation region 43a of the semiconductor layer 41', and the well region 42 is located beneath the top surface 41a and in contact with the top surface 41a in the vertical direction. The floating region 45a which has P-type conductivity is formed in the well region 42, beneath the top surface 41a and in contact with the top surface 41a. The floating region 45a has a first impurity concentration. The first impurity concentration refers to the net a second impurity concentration in the floating region 45a, that is, the total concentration of the second impurities minus the total concentration of the first impurities (the concentrations of other regions are calculated in the same way). The bias region 45b which has P-type conductivity is formed in the well region 42, beneath the top surface 41a and in contact with the top surface 41a, and the bias region 45b has a second impurity concentration. The floating region 45a and the bias region 45b are both located in the drift region 42a. The bias region 45b is electrically connected to a predetermined bias voltage, for example but not limited to, electrically connected to the body electrode 46', and the floating region 45a is electrically floating. In a preferable embodiment, the high voltage device 400 further includes a conductive plug 451b and a wire 452b. The conductive plug 451b is electrically connected to the bias region 45b, by penetrating through the drift oxide region 44, to serve as an electrical contact of the bias region 45b. The conductive plug 451b is electrically connected with the body electrode 46' via the wire 452b so that the bias region 45b is electrically connected to the body electrode 46'.

The body region 46 which has P-type conductivity is formed in the well region 42 in the operation region 43a. The body region 46 is located beneath the top surface 41a and in contact with the top surface 41a in the vertical direction. The body region 46 contacts the well region 42 in the channel direction (as indicated by the dashed arrow in the figure) and the body region 46 has a third impurity concentration, wherein the third impurity concentration is higher than the first impurity concentration and the second impurity concentration. The body electrode 46' which has P-type conductivity serves as an electrical contact of the body region 46, and the body electrode 46' is formed in the body region 46, beneath the top surface 41a and in contact with the top surface 41a in the vertical direction. The gate 47 is formed on the top surface 41a in the operation region 43a of the semiconductor layer 41', wherein a portion of the body region 46 is located below the gate 47 and in contact with the gate 47 to provide an inversion region of the high voltage device 400 during ON operation.

Still referring to FIG. 4, the source 48 and the drain 49 have N-type conductivity. The source 48 and the drain 49 are formed in the operation region 43a, beneath the top surface 41a and in contact with the top surface 41a in the vertical direction. The source 48 and the drain 49 are respectively located at two lateral sides of the gate 47, wherein the source 48 is located in the body region 46, and the drain 49 is located in the well region 42 and away from the body region 46. In the channel direction, the drift region 42a is located between the drain 49 and the body region 46, in the well region 42 near the top surface 41a, to serve as a drift current channel of the high voltage device 400 during ON operation. In a preferable embodiment, as shown in FIG. 4, the floating region 45a and the bias region 45b are not in contact with each other, and the floating region 45a and the bias region 45b are separated by the well region 42 in the channel direction.

This embodiment differs from the first embodiment in that, in the first embodiment, the drift oxide well 24 is a LOCOS structure, while in the present embodiment, the drift oxide well 44 is an STI structure. The STI structure can be formed by methods known to a person having ordinary skill in the art, so the details thereof are not redundantly explained here.

Figure 5:
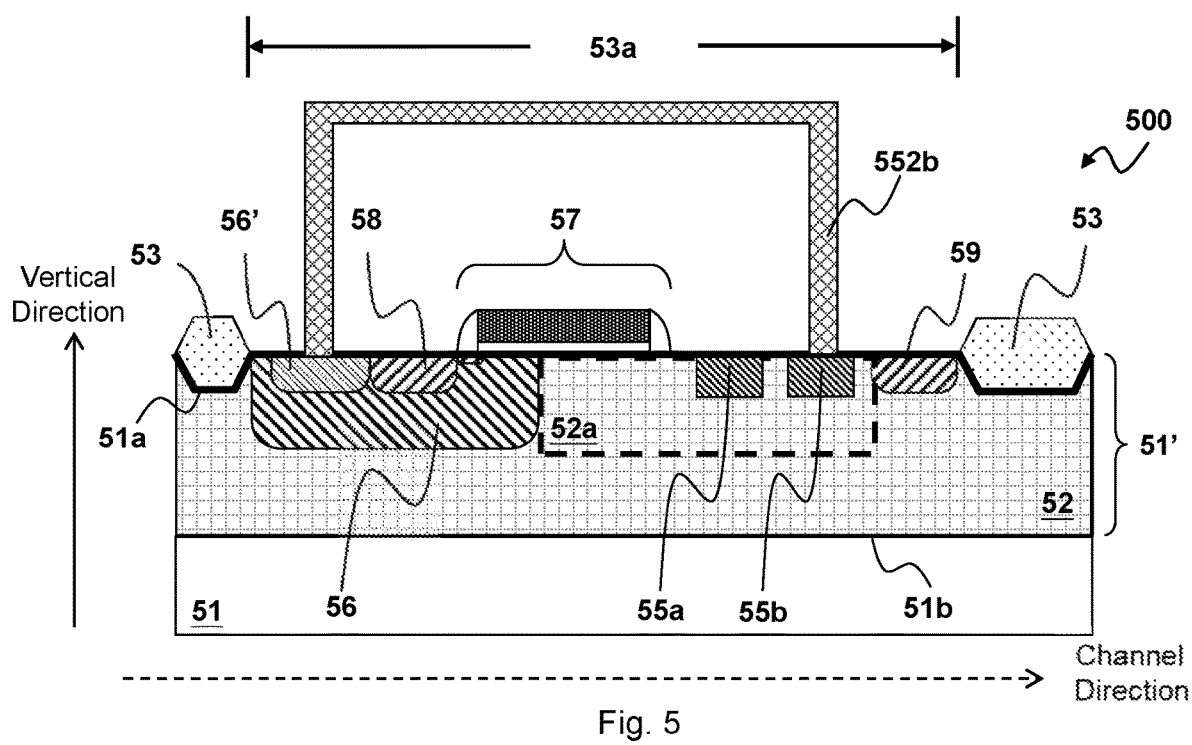
FIG. 5 shows a fourth embodiment of the present invention.

Please refer to FIG. 5, which shows a fourth embodiment of the present invention. FIG. 5 shows a cross-section view of a high voltage device 500. As show in FIG. 5, the high voltage device 500 includes a semiconductor layer layer 51', a well region 52, an isolation structure 53, a drift oxide region 54, a floating region 55a, a bias region 55b, a body region 56, a body electrode 56', a gate 47, a source 58 and a drain 59. The semiconductor layer 51' which is formed on the substrate has a top surface 51a and a bottom surface 51b opposite to the top surface 51a in the vertical direction (as indicated by the direction of the solid arrow in FIG. 5). The substrate 51 is, for example but not limited to, a P-type or N-type semiconductor silicon substrate. The semiconductor layer 51', for example, is formed on the substrate 51 by epitaxy, or a part of the substrate 51 is used to form the semiconductor layer 51'. The semiconductor layer 51' can be formed by various methods known to a person having ordinary skill in the art, so the details thereof are not redundantly explained here.

Still referring to FIG. 5, the isolation structure 53 is formed on and in contact with the top surface 51a, for defining an operation region 53a. The isolation structure 53 is not limited to a local oxidation of silicon (LOCOS) structure as shown in FIG. 5, and may be a shallow trench isolation (STI) structure instead.

The well region 52 which has N-type conductivity is formed in the operation region 53a of the semiconductor layer 51', and the well region 52 is located beneath the top surface 51a and in contact with the top surface 51a in the vertical direction. The floating region 55a which has P-type conductivity is formed in the well region 52, beneath the top surface 51a and in contact with the top surface 51a. The floating region 55a has a first impurity concentration. The first impurity concentration refers to the net a second impurity concentration in the floating region 55a, that is, the total concentration of the second impurities minus the total concentration of the first impurities (the concentrations of other regions are calculated in the same way). The bias region 55b which has P-type conductivity is formed in the well region 52, beneath the top surface 51a and in contact with the top surface 51a, and the bias region 55b has a second impurity concentration. The floating region 55a and the bias region 55b are both located in the drift region 52a. The bias region 55b is electrically connected to a predetermined bias voltage, for example but not limited to, electrically connected to the body electrode 56', and the floating region 55a is electrically floating. In a preferable embodiment, the high voltage device 500 further includes a wire 552b, which electrically connects the bias region 55b to the body electrode 56'.

The body region 56 which has P-type conductivity is formed in the well region 52 in the operation region 53a. The body region 56 is located beneath the top surface 51a and in contact with the top surface 51a in the vertical direction. The body region 56 contacts the well region 52 in the channel direction (as indicated by the dashed arrow in the figure) and the body region 56 has a third impurity concentration, wherein the third impurity concentration is higher than the first impurity concentration and the second impurity concentration. The body electrode 56' which has P-type conductivity serves as an electrical contact of the body region 56, and the body electrode 56' is formed in the body region 56, beneath the top surface 51*a* and in contact with the top surface 51*a* in the vertical direction. The gate 57 is formed on the top surface 51*a* in the operation region 53*a* of the semiconductor layer 51', wherein a portion of the body region 56 is located below the gate 57 and in contact with the gate 57 to provide an inversion region of the high voltage device 500 during ON operation.

Still referring to FIG. 5, the source 58 and the drain 59 have N-type conductivity. The source 58 and the drain 59 are formed in the operation region 53*a*, beneath the top surface 51*a* and in contact with the top surface 51*a* in the vertical direction. The source 58 and the drain 59 are respectively located at two lateral sides of the gate 57, wherein the source 58 is located in the body region 56, and the drain 59 is located in the well region 52 and away from the body region 56. In the channel direction, the drift region 52*a* is located between the drain 59 and the body region 56, in the well region 52 near the top surface 51*a*, to serve as a drift current channel of the high voltage device 500 during ON operation. In a preferable embodiment, as shown in FIG. 5, the floating region 55*a* and the bias region 55*b* are not in contact with each other, and the floating region 55*a* and the bias region 55*b* are separated by the well region 52 in the channel direction.

Figure 6:
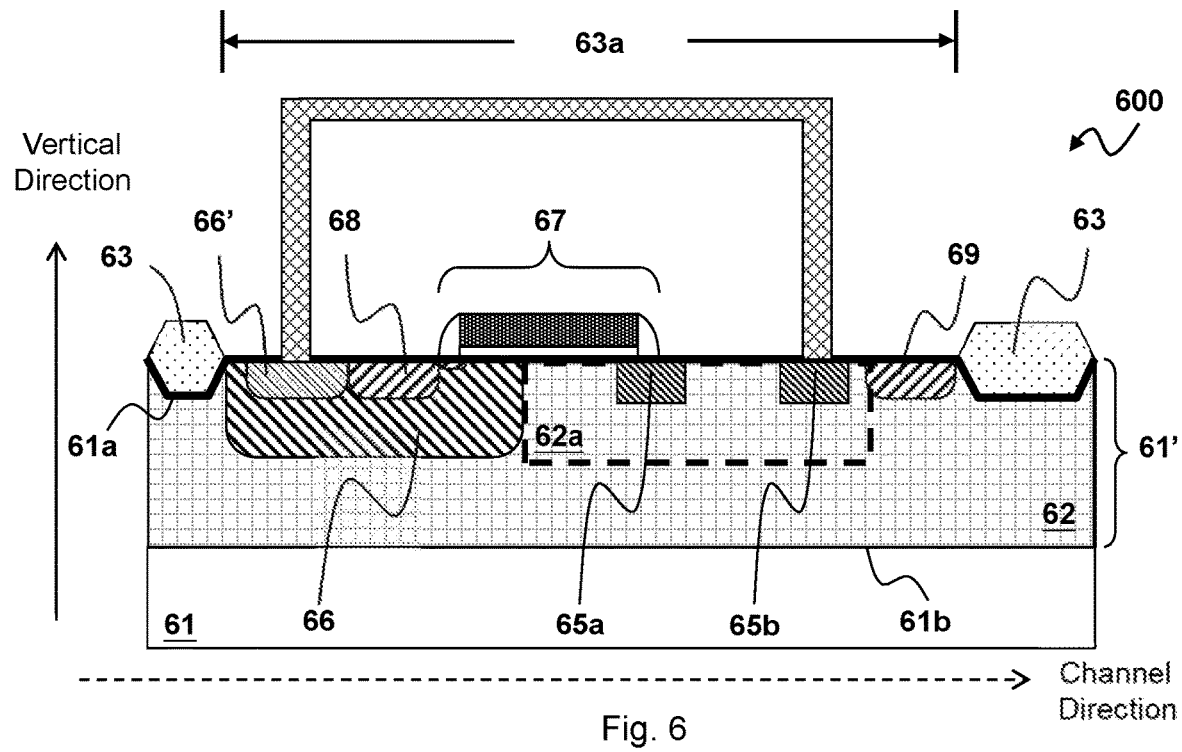
FIG. 6 shows a fifth embodiment of the present invention.

Please refer to FIG. 6, which shows a fifth embodiment of the present invention. FIG. 6 shows a cross-section view of a high voltage device 600. As show in FIG. 6, the high voltage device 600 includes a semiconductor layer layer 61', a well region 62, an isolation structure 63, a drift oxide region 64, a floating region 65*a*, a bias region 65*b*, a body region 66, a body electrode 66', a gate 67, a source 68 and a drain 69. The semiconductor layer 61' which is formed on the substrate has a top surface 61*a* and a bottom surface 61*b* opposite to the top surface 61*a* in the vertical direction (as indicated by the direction of the solid arrow in FIG. 6). The substrate 61 is, for example but not limited to, a P-type or N-type semiconductor silicon substrate. The semiconductor layer 61', for example, is formed on the substrate 61 by epitaxy, or a part of the substrate 61 is used to form the semiconductor layer 61'. The semiconductor layer 61' can be formed by various methods known to a person having ordinary skill in the art, so the details thereof are not redundantly explained here.

Still referring to FIG. 6, the isolation structure 63 is formed on and in contact with the top surface 61*a*, for defining an operation region 63*a*. The isolation structure 63 is not limited to a local oxidation of silicon (LOCOS) structure as shown in FIG. 6, and may be a shallow trench isolation (STI) structure instead.

The well region 62 which has N-type conductivity is formed in the operation region 63*a* of the semiconductor layer 61', and the well region 62 is located beneath the top surface 61*a* and in contact with the top surface 61*a* in the vertical direction. The floating region 65*a* which has P-type conductivity is formed in the well region 62, beneath the top surface 61*a* and in contact with the top surface 61*a*. The floating region 65*a* has a first impurity concentration. The first impurity concentration refers to the net a second impurity concentration in the floating region 65*a*, that is, the total concentration of the second impurities minus the total concentration of the first impurities (the concentrations of other regions are calculated in the same way). The bias region 65*b* which has P-type conductivity is formed in the well region 62, beneath the top surface 61*a* and in contact with the top surface 61*a*, and the bias region 65*b* has a second impurity concentration. The floating region 65*a* and the bias region 65*b* are both located in the drift region 62*a*. The bias region 65*b* is electrically connected to a predetermined bias voltage, for example but not limited to, electrically connected to the body electrode 66', and the floating region 65*a* is electrically floating. In a preferable embodiment, the high voltage device 600 further includes a wire 652*b*, which electrically connects the bias region 65*b* to the body electrode 66'.

The body region 66 which has P-type conductivity is formed in the well region 62 of the operation region 63*a*. The body region 66 is located beneath the top surface 61*a* and in contact with the top surface 61*a* in the vertical direction. The body region 66 contacts the well region 62 in the channel direction (as indicated by the dashed arrow in the figure) and the body region 66 has the third impurity concentration, wherein the third impurity concentration is higher than the first impurity concentration and the second impurity concentration. The body electrode 66' which has P-type conductivity is formed in the body region 66 to serve as an electrical contact of the body region 66, and the body electrode 66' is formed beneath the top surface 61*a* and in contact with the top surface 61 in the vertical direction. The gate 67 is formed on the top surface 61*a* in the operation region 63*a* of the semiconductor layer 61' and a portion of the body region 66 is located below the gate 67 and in contact with the gate 67 in the vertical direction to provide an inversion region of the high voltage device 600 during ON operation.

Still referring to FIG. 6, the source 68 and the drain 69 have N-type conductivity. The source 68 and the drain 69 are formed in the operation region 63*a*, beneath the top surface 61*a* and in contact with the top surface 61*a* in the vertical direction. The source 68 and the drain 69 are respectively located at two lateral sides of the gate 67, wherein the source 68 is located in the body region 66, and the drain 69 is located in the well region 62 and away from the body region 66. In the channel direction, the drift region 62*a* is located between the drain 69 and the body region 66, in the well region 62 near the top surface 61*a*, to serve as a drift current channel of the high voltage device 600 during ON operation. In a preferable embodiment, as shown in FIG. 6, the floating region 65*a* and the bias region 65*b* are not in contact with each other, and the floating region 65*a* and the bias region 65*b* are separated by the well region 62 in the channel direction.

This embodiment differs from the fourth embodiment in that, in the fourth embodiment, the floating region 55*a* and the bias region 55*b* are both not located below the gate 57, while in the present embodiment, at least a portion of the floating region 65*a* is located below the gate 67, that is, a portion of the gate 67 is located on the floating region 65*a*. In one embodiment of the present invention, a portion of the gate 67 is located on the floating region 65*a* or the bias region 65*b*.

Figure 7:
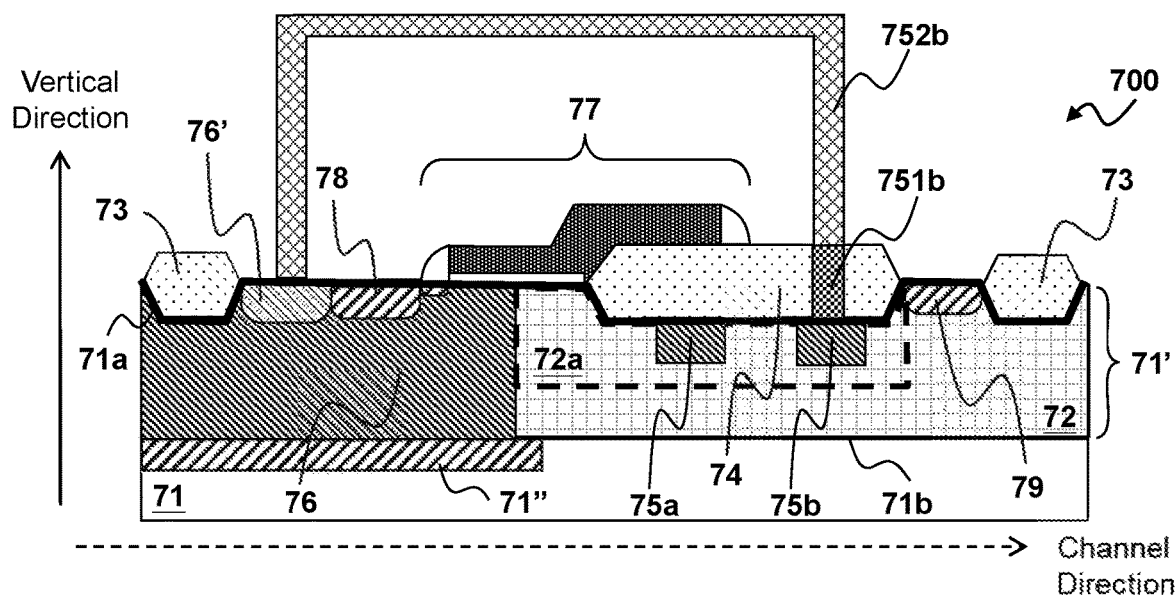
FIG. 7 shows a sixth embodiment of the present invention.

Please refer to FIG. 7, which shows a sixth embodiment of the present invention. FIG. 7 shows a cross-section view of a high voltage device 700. As show in FIG. 7, the high voltage device 700 includes a semiconductor layer layer 71', a buried layer 71", a well region 72, an isolation structure 73, a drift oxide region 74, a floating region 75*a*, a bias region 75*b*, a well region 76, a well contact 76', a gate 77, a source 78 and a drain 79. The semiconductor layer 71' which is formed on the substrate has a top surface 71*a* and a bottom surface 71*b* opposite to the top surface 71*a* in the vertical direction (as indicated by the direction of the solid arrow in FIG. 7). The substrate 71 is, for example but not limited to, a P-type or N-type semiconductor silicon substrate. The semiconductor layer 71', for example, is formed on the substrate 71 by epitaxy, or a part of the substrate 71 is used to form the semiconductor layer 71'. The semiconductor layer 71' can be formed by various methods known to a person having ordinary skill in the art, so the details thereof are not redundantly explained here.

Still referring to FIG. 7, the isolation structure 73 is formed on and in contact with the top surface 71*a* for defining an operation region 73*a*. The isolation structure 73 is not limited to a local oxidation of silicon (LOCOS) structure as shown in the figure, and may be a shallow trench isolation (STI) structure or a chemical vapor deposition (CVD) oxide structure. The drift oxide region 74 is formed on and in contact with the top surface 71*a* and is located on a part of the drift region 72*a* (as indicated by the dashed line frame in FIG. 7) in the operation region 73*a*. The drift oxide region 74 can be formed, for example, by the same process steps for forming the isolation structure 73, so that the drift oxide region 74 and the isolation structure 73 are formed at the same time. As show in the figure, the floating region 75*a* and the bias region 75*b* are located below the drift oxide region 74 and contact the drift oxide region 74.

The well region 72 which has N-type conductivity is formed in the operation region 73*a* of the semiconductor layer 71', and the well region 72 is located beneath the top surface 71*a* and in contact with the top surface 71*a* in the vertical direction. The floating region 75*a* which has P-type conductivity is formed in the well region 72, beneath the top surface 71*a* and in contact with the top surface 71*a*. The floating region 75*a* has a first impurity concentration. The first impurity concentration refers to the net a second impurity concentration in the floating region 75*a*, that is, the total concentration of the second impurities minus the total concentration of the first impurities (the concentrations of other regions are calculated in the same way). The bias region 75*b* which has P-type conductivity is formed in the well region 72, beneath the top surface 71*a* and in contact with the top surface 71*a* and the bias region 75*b* has a second impurity concentration. The floating region 75*a* and the bias region 75*b* are both located in the drift region 72*a*. The bias region 75*b* is electrically connected to a predetermined bias voltage, for example but not limited to, electrically connected to the well contact 76', and the floating region 75*a* is electrically floating. In a preferable embodiment, the high voltage device 700 further includes a conductive plug 751*b* and a wire 752*b*. The conductive plug 751*b* is electrically connected to the bias region 75*b*, by penetrating through the drift oxide region 74, to serve as an electrical contact of the bias region 75*b*. The conductive plug 751*b* is electrically connected with the well contact 76' via the wire 752*b* so that the bias region 75*b* is electrically connected to the well contact 76'.

The well region 76 corresponds to the body regions 26, 36, 46, 56, and 66 of the first embodiment to the fifth embodiment, but the well region 76 of the present embodiment differs from the body regions 26, 36, 46, 56, and 66 of the first embodiment to the fifth embodiment in that the buried layer 71" is interposed between the well region 76 and the substrate 71, and the well region 76 only contacts the well region 72 in the channel direction (shown by the dashed arrow in the figure) but does not contact the well region 72 in the vertical direction. The buried layer 71" is formed beneath the well region 76 (which may be regarded as one form of the body region) and in contact with the well region 76, and the buried layer 71" completely covers a lower boundary of the well region 76. The well region 76 which has P-type conductivity is formed in the well region 72, at least in the operation region 73*a*, and the well region 76 is located beneath the top surface 71*a* and in contact with the top surface 71*a* in the vertical direction. The well region 76 has the third impurity concentration, wherein the third impurity concentration is higher than the first impurity concentration and the second impurity concentration. The well contact 76' which has P-type conductivity is formed in the well region 76 to serve as an electrical contact of the well region 76, and the well contact 76' is formed beneath the top surface 71*a* and in contact with the top surface 71 in the vertical direction. The gate 77 is formed on the top surface 71*a* in the operation region 73*a* of the semiconductor layer 71'and a portion of the well region 76 is located below the gate 77 and in contact with the gate 77 in the vertical direction to provide an inversion region of the high voltage device 700 during ON operation.

Still referring to FIG. 7, the source 78 and the drain 79 have N-type conductivity. The source 78 and the drain 79 are formed in the operation region 73*a*, beneath the top surface 71*a* and in contact with the top surface 71*a* in the vertical direction. The source 78 and the drain 79 are respectively located at two lateral sides of the gate 77, wherein the source 78 is located in the well region 76, and the drain 79 is located in the well region 72 and away from the well region 76. In the channel direction, the drift region 72*a* is located between the drain 79 and the well region 76, in the well region 72 near the top surface 71*a*, to serve as a drift current channel of the high voltage device 700 during ON operation. In a preferable embodiment, as shown in FIG. 7, the floating region 75*a* and the bias region 75*b* are not in contact with each other, and the floating region 75*a* and the bias region 75*b* are separated by the well region 72 in the channel direction.

Figure 8:
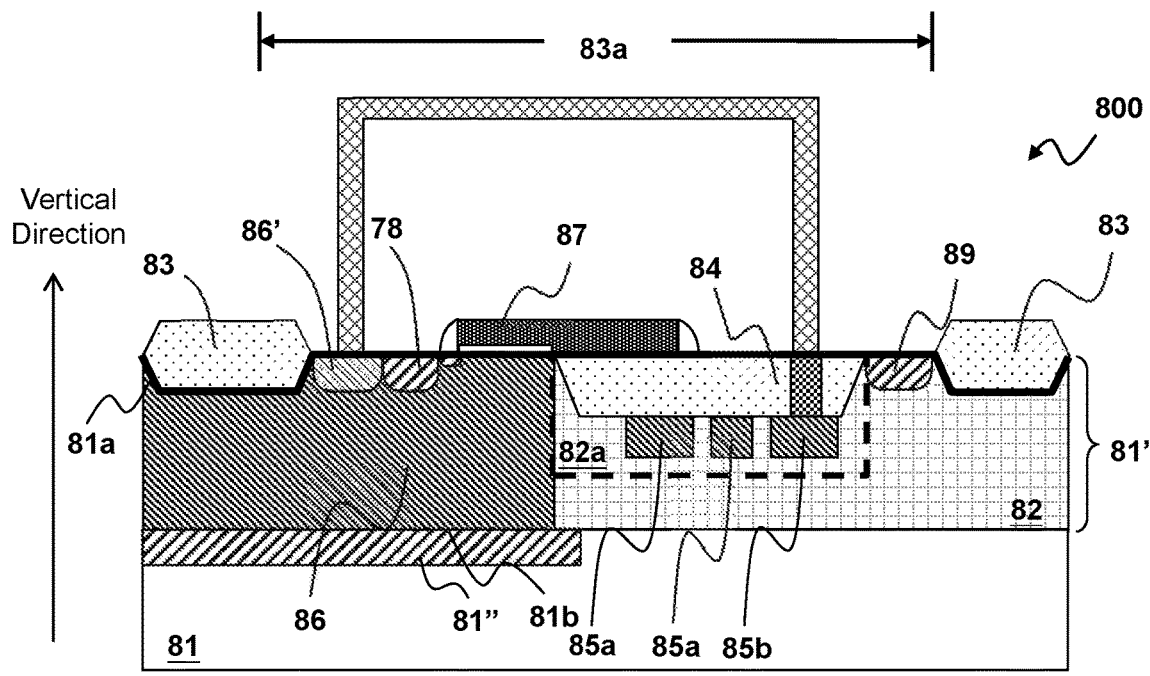
FIG. 8 shows a seventh embodiment of the present invention.

Please refer to FIG. 8, which shows a seventh embodiment of the present invention. FIG. 8 shows a cross-section view of a high voltage device 800. As show in FIG. 8, the high voltage device 800 includes a semiconductor layer layer 81', a buried layer 81", a well region 82, an isolation structure 83, a drift oxide region 84, floating regions 85*a*, a bias region 85*b*, a well region 86, a well contact 86', a gate 87, a source 88 and a drain 89. The semiconductor layer 81' which is formed on the substrate has a top surface 81*a* and a bottom surface 81*b* opposite to the top surface 81*a* in the vertical direction (as indicated by the direction of the solid arrow in FIG. 8). The substrate 81 is, for example but not limited to, a P-type or N-type semiconductor silicon substrate. The semiconductor layer 81', for example, is formed on the substrate 81 by epitaxy, or a part of the substrate 81 is used to form the semiconductor layer 81'. The semiconductor layer 81' can be formed by various methods known to a person having ordinary skill in the art, so the details thereof are not redundantly explained here.

Still referring to FIG. 8, the isolation structure 83 is formed on and in contact with the top surface 81*a* for defining an operation region 83*a*. The isolation structure 83 is not limited to a local oxidation of silicon (LOCOS) structure as shown in the figure, and may be a shallow trench isolation (STI) structure or a chemical vapor deposition (CVD) oxide structure. The drift oxide region 84 is formed on and in contact with the top surface 81*a* and is located on a part of the drift region 82*a* (as indicated by the dashed line frame in FIG. 8) in the operation region 83*a*. In this embodiment, the drift oxide region 84 is an STI structure and the isolation structure 83 is a LOCOS structure. In another embodiment, both the drift oxide region 84 and the isolation structure 83 are STI structures, and in this case the drift oxide region 84 can be formed by the same process steps for forming the isolation structure 83, such that they are formed at the same time. As show in the figure, the floating region 85a and the bias region 85b are located below the drift oxide region 84 and contact the drift oxide region 84.

The well region 82 which has N-type conductivity is formed in the operation region 83a of the semiconductor layer 81', and the well region 82 is located beneath the top surface 81a and in contact with the top surface 81a in the vertical direction. Plural floating regions 85a which have P-type conductivity are formed in the well region 82, beneath the top surface 81a and in contact with the top surface 81a. The floating regions 85a have a first impurity concentration. The first impurity concentration refers to the net a second impurity concentration in the floating regions 85a, that is, the total concentration of the second impurities minus the total concentration of the first impurities (the concentrations of other regions are calculated in the same way). The bias region 85b which has P-type conductivity is formed in the well region 82, beneath the top surface 81a and in contact with the top surface 81a and the bias region 85b has a second impurity concentration. The floating region 85a and the bias region 85b are both located in the drift region 82a. The bias region 85b is electrically connected to a predetermined bias voltage, for example but not limited to, electrically connected to the well contact 86', and the floating regions 85a are electrically floating. In a preferable embodiment, the high voltage device 800 further includes a conductive plug 851b and a wire 852b. The conductive plug 851b is electrically connected to the bias region 85b, by penetrating through the drift oxide region 84, to serve as an electrical contact of the bias region 85b. The conductive plug 851b is electrically connected with the well contact 86' via the wire 852b so that the bias region 85b is electrically connected to the well contact 86'.

The well region 86 corresponds to the body regions 26, 36, 46, 56, and 66 of the first embodiment to the fifth embodiment, but the well region 86 of the present embodiment differs from the body regions 26, 36, 46, 56, and 66 of the first embodiment to the fifth embodiment in that the buried layer 81" is interposed between the well region 86 and the substrate 81, and the well region 86 only contacts the well region 82 in the channel direction (shown by the dashed arrow in the figure) but does not contact the well region 82 in the vertical direction. The well region 86 which has P-type conductivity is formed in the well region 82, at least in the operation region 83a, and the well region 86 is located beneath the top surface 81a and in contact with the top surface 81a in the vertical direction. The well region 86 has the third impurity concentration, wherein the third impurity concentration is higher than the first impurity concentration and the second impurity concentration. The well contact 86' which has P-type conductivity is formed in the well region 86 to serve as an electrical contact of the well region 86, and the well contact 86' is formed beneath the top surface 81a and in contact with the top surface 81 in the vertical direction. The gate 87 is formed on the top surface 81a in the operation region 83a of the semiconductor layer 81' and a portion of the well region 86 is located below the gate 87 and in contact with the gate 87 in the vertical direction to provide an inversion region of the high voltage device 800 during ON operation.

Still referring to FIG. 8, the source 88 and the drain 89 have N-type conductivity. The source 88 and the drain 89 are formed in the operation region 83a, beneath the top surface 81a and in contact with the top surface 81a in the vertical direction. The source 88 and the drain 89 are respectively located at two lateral sides of the gate 87, wherein the source 88 is located in the well region 86, and the drain 89 is located in the well region 82 and away from the well region 86. In the channel direction, the drift region 82a is located between the drain 89 and the well region 86, in the well region 82 near the top surface 81a, to serve as a drift current channel of the high voltage device 800 during ON operation. In a preferable embodiment, as shown in FIG. 8, the floating region 85a and the bias region 85b are not in contact with each other, and the floating region 85a and the bias region 85b are separated by the well region 82 in the channel direction.

This embodiment differs from the sixth embodiment in that, in the sixth embodiment, the drift oxide region 74 is a LOCOS structure, while in the present embodiment, the drift oxide region 84 is a STI structure. The STI structure can be formed by methods well known to a person having ordinary skill in the art, so the details thereof are not redundantly explained here. In addition, in this embodiment, there are plural floating regions 85a instead of only one single region (shown to be two regions but can be more than two). Note that there can be plural bias regions 85b as well.

Figure 9:
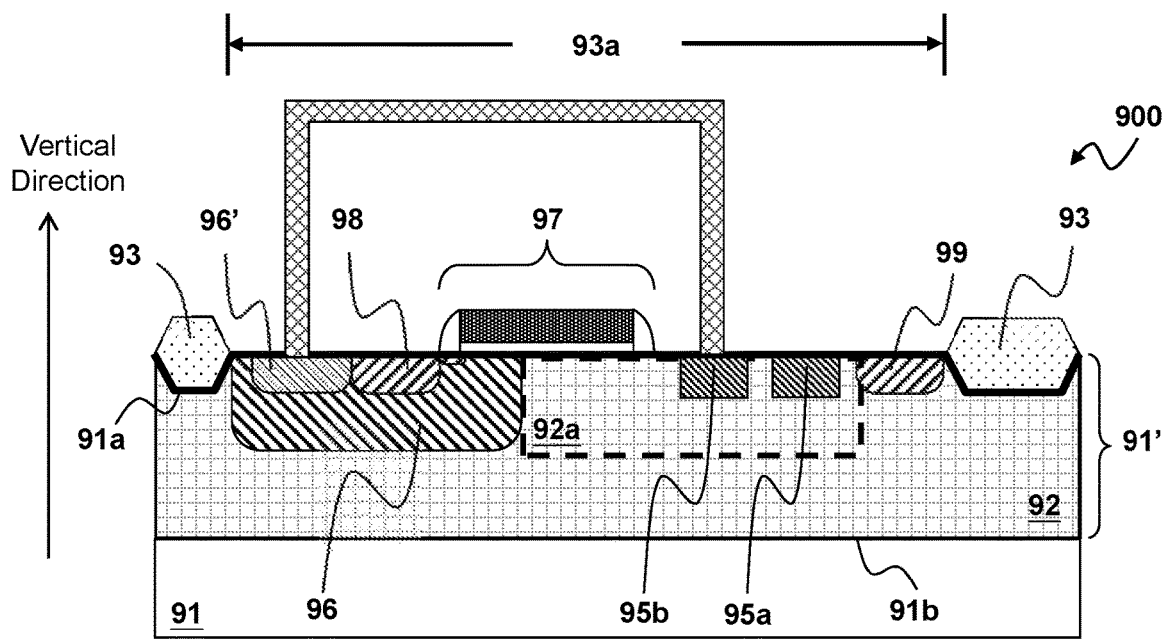
FIG. 9 shows an eighth embodiment of the present invention.

Please refer to FIG. 9, which shows a fourth embodiment of the present invention. FIG. 9 shows a cross-section view of a high voltage device 900. As show in FIG. 9, the high voltage device 900 includes a semiconductor layer layer 91', a well region 92, an isolation structure 93, a floating region 95a, a bias region 95b, a body region 96, a body electrode 96', a gate 97, a source 98 and a drain 99. The semiconductor layer 91' which is formed on the substrate has a top surface 91a and a bottom surface 91b opposite to the top surface 91a in the vertical direction (as indicated by the direction of the solid arrow in FIG. 9). The substrate 91 is, for example but not limited to, a P-type or N-type semiconductor silicon substrate. The semiconductor layer 91', for example, is formed on the substrate 91 by epitaxy, or a part of the substrate 91 is used to form the semiconductor layer 91'. The semiconductor layer 91' can be formed by various methods known to a person having ordinary skill in the art, so the details thereof are not redundantly explained here.

Still referring to FIG. 9, the isolation structure 93 is formed on and in contact with the top surface 91a, for defining an operation region 93a. The isolation structure 93 is not limited to a local oxidation of silicon (LOCOS) structure as shown in FIG. 9, but may be a shallow trench isolation (STI) structure instead.

The well region 92 which has N-type conductivity is formed in the operation region 93a of the semiconductor layer 91', and the well region 92 is located beneath the top surface 91a and in contact with the top surface 91a in the vertical direction. The floating region 95a which has P-type conductivity is formed in the well region 92, beneath the top surface 91a and in contact with the top surface 91a. The floating region 95a has a first impurity concentration. The first impurity concentration refers to the net a second impurity concentration in the floating region 95a, that is, the total concentration of the second impurities minus the total concentration of the first impurities (the concentrations of other regions are calculated in the same way). The bias region 95b which has P-type conductivity is formed in the well region 92, beneath the top surface 91a and in contact with the top surface 91a, and the bias region 95b has a second impurity concentration. The floating region 95a and the bias region 95b are both located in the drift region 92a. The bias region 95b is electrically connected to a predetermined bias voltage, for example but not limited to, electrically connected to the body electrode 96', and the floating region 95a is electrically floating. In a preferable embodiment, the high voltage device 900 further includes a wire 952b, which electrically connects the bias region 95b to the body electrode 96'.

The body region 96 which has P-type conductivity is formed in the well region 92 in the operation region 93a. The body region 96 is located beneath the top surface 91a and in contact with the top surface 91a in the vertical direction. The body region 96 contacts the well region 92 in the channel direction (as indicated by the dashed arrow in the figure) and the body region 96 has a third impurity concentration, wherein the third impurity concentration is higher than the first impurity concentration and the second impurity concentration. The body electrode 96' which has P-type conductivity serves as an electrical contact of the body region 96, and the body electrode 96' is formed in the body region 96, beneath the top surface 91a and in contact with the top surface 91a in the vertical direction. The gate 97 is formed on the top surface 91a in the operation region 93a of the semiconductor layer 91', wherein a portion of the body region 96 is located below the gate 97 and in contact with the gate 97 to provide an inversion region of the high voltage device 900 during ON operation.

Still referring to FIG. 9, the source 98 and the drain 99 have N-type conductivity. The source 98 and the drain 99 are formed in the operation region 93a, beneath the top surface 91a and in contact with the top surface 91a in the vertical direction. The source 98 and the drain 99 are respectively located at two lateral sides of the gate 97, wherein the source 98 is located in the body region 96, and the drain 99 is located in the well region 92 and away from the body region 96. In the channel direction, the drift region 92a is located between the drain 99 and the body region 96, in the well region 92 near the top surface 91a, to serve as a drift current channel of the high voltage device 900 during ON operation. In a preferable embodiment, as shown in FIG. 9, the floating region 95a and the bias region 95b are not in contact with each other, and the floating region 95a and the bias region 95b are separated by the well region 92 in the channel direction.

This embodiment differs from the fourth embodiment in that, in the present embodiment, the bias region 95b is closer to the source 98 than the floating region 95a is in the channel direction; in the fourth embodiment, the floating region 55a is closer to the source 58 than the bias region 55b is in the channel direction.

Figure 10A:
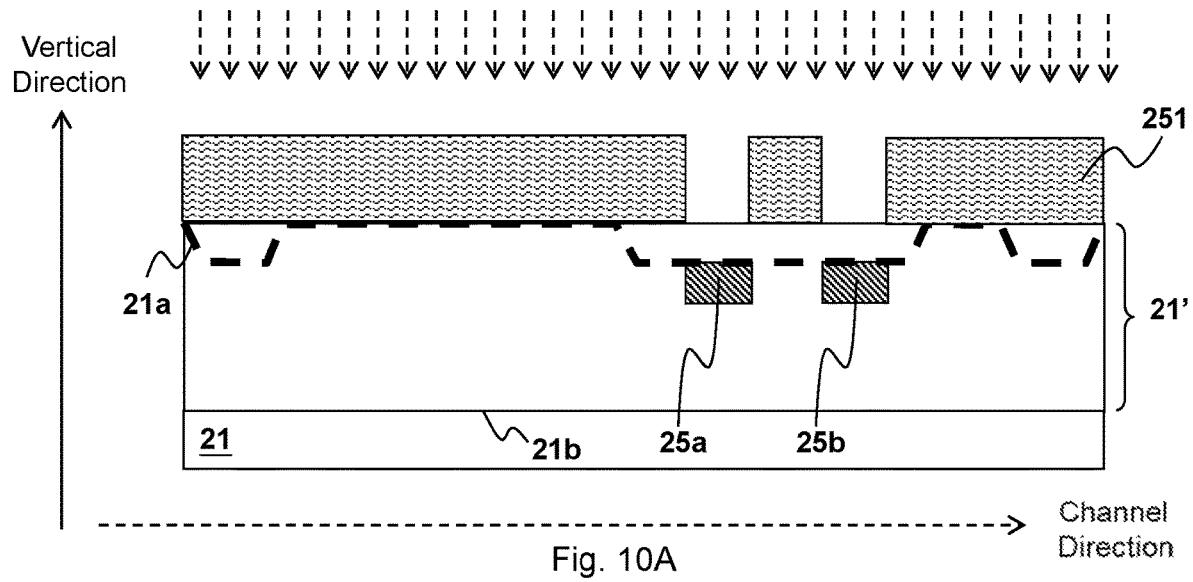
FIGS. 10A to 10H show a ninth embodiment of the present invention.

Please refer to FIGS. 10A to 10H, which show a ninth embodiment of the present invention. FIGS. 10A to 10H are schematic cross-section views showing a manufacturing method of the high voltage device 200. As shown in FIG. 10A, a semiconductor layer 21' is first formed on a substrate 21, and the semiconductor layer 21' has a top surface 21a and a bottom surface 21b opposite to the top surface 21a in the vertical direction (as indicated by the direction of the solid arrow in FIG. 10A). At this stage, the isolation structure 23 and the drift oxide region 24 have not yet been formed, so the final top surface 21a is not yet completely defined; the final top surface 21a is as indicated by the dashed line in the figure. The substrate 21 is, for example but not limited to, a P-type or N-type semiconductor silicon substrate. The semiconductor layer 21', for example, is formed on the substrate 21 by epitaxy, or a part of the substrate 21 is used to form the semiconductor layer 21'. The semiconductor layer 21' can be formed by various methods known to a person having ordinary skill in the art, so the details thereof are not redundantly explained here.

Still referring to FIG. 10A, next, a floating region 25a and a bias region 25b are formed, which will be located in a well region 22 to be formed later. The floating region 25a and the bias region 25b can be formed by, for example, forming a photoresist layer 251 as a mask by a lithography process and doping a second impurities into the semiconductor layer 21' in the form of accelerated ions by an ion implantation process, so that the floating region 25a has a first impurity concentration and the bias region 25b has a second impurity concentration. In this embodiment, the floating region 25a and the bias region 25b are formed, for example, by the same ion implantation process, so the first impurity concentration is equal to the second impurity concentration. In other embodiments, different photoresist layers and different ion implantation processes may be used to form the floating region 25a and the bias region 25b so that the first impurity concentration is different from the second impurity concentration.

Figure 10B:
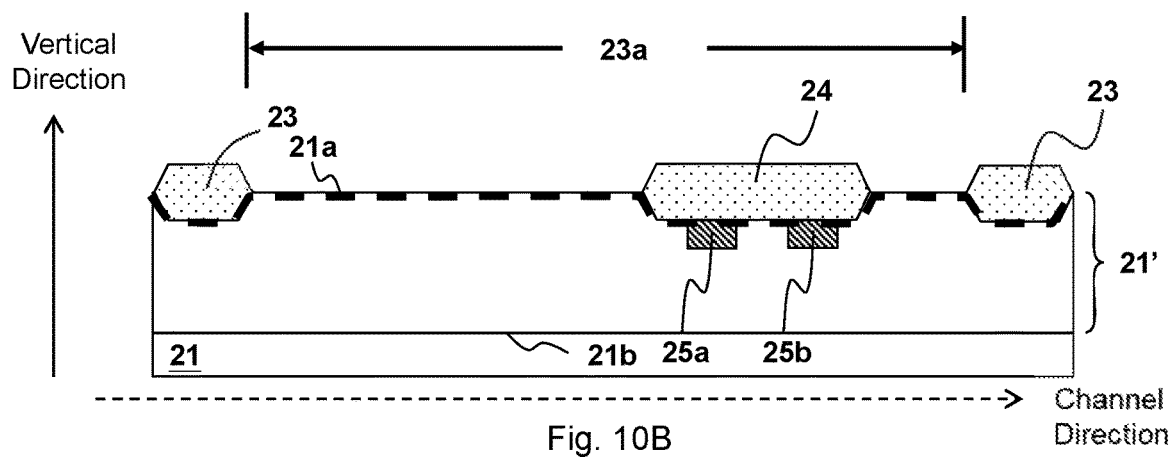

Next, please refer to FIG. 10B. An isolation structure 23 and a drift oxide region 24 are formed on and in contact with the top surface 21a; the isolation structure 23 defines an operation region 23a. The isolation structure 23 is not limited to a local oxidation of silicon (LOCOS) structure and may be a shallow trench isolation (STI) structure instead. The drift oxide region 24 is located on the drift region 22a in the operation region 23a and in contact with the drift region 22a (which will be defined after the step of FIG. 10D).

Figure 10C:
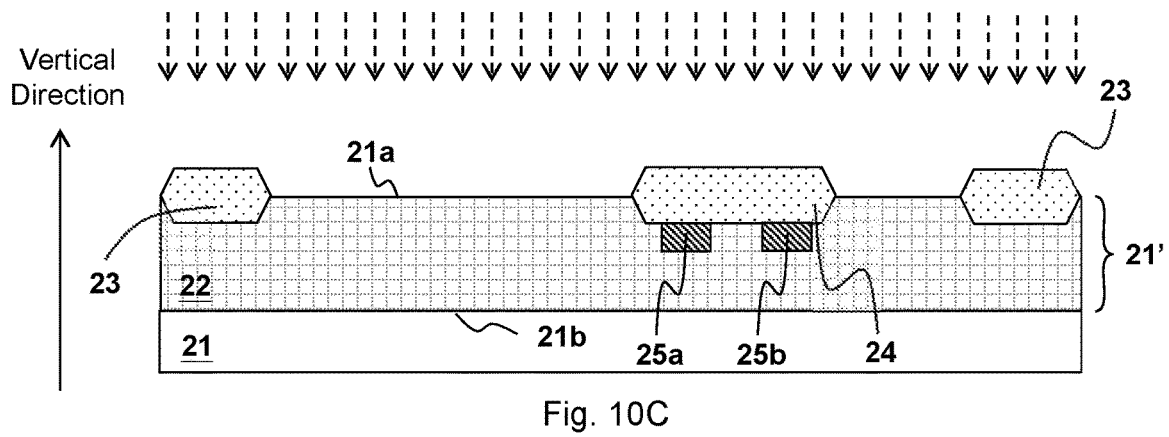

Next, please refer to FIG. 10C. A well region 22 is formed in the operation region 23a of the semiconductor layer 21', and the well region 22 is located beneath the top surface 21a and in contact with the top surface 21a in the vertical direction. The well region 22 has N-type conductivity, which can be formed by, for example, an ion implantation process which implants a first impurities into the operation region 23a in the form of accelerated ions, as indicated by the dashed arrows in FIG. 10C, to form the well region 22.

Figure 10D:
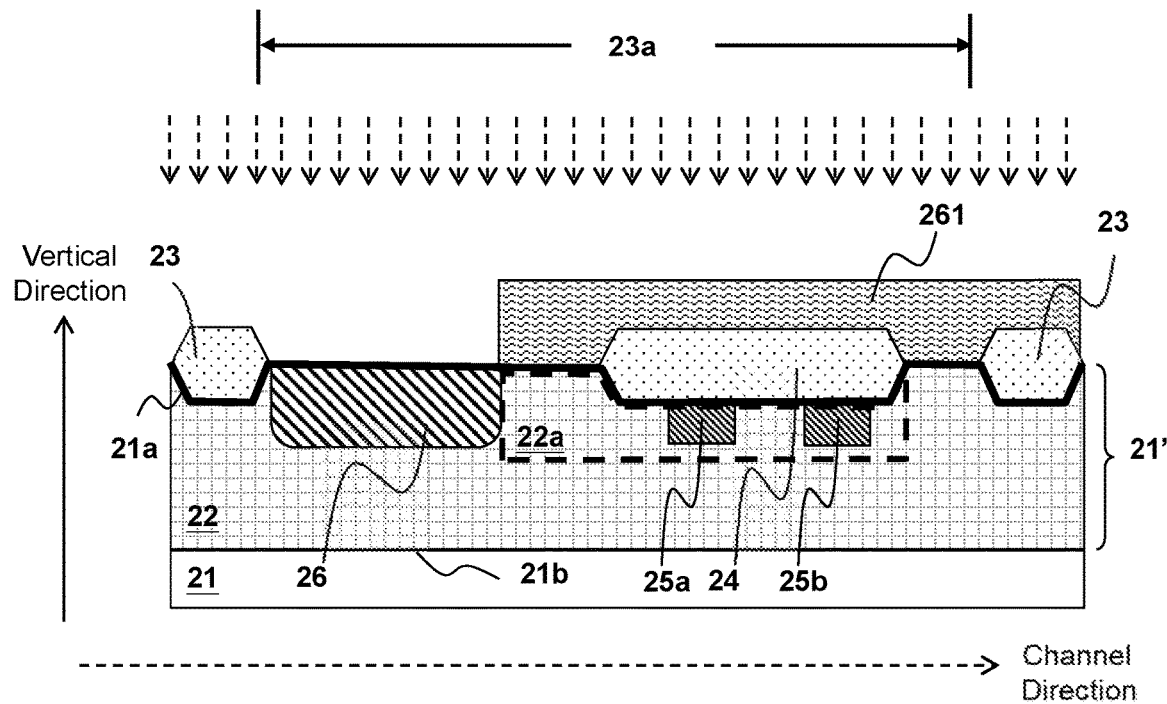

Next, please refer to FIG. 10D. A body region 26 is formed in the well region 22, in the operation region 23a, and the body region 26 is located beneath the top surface 21a and in contact with the top surface 21a in the vertical direction. The body region 26 has P-type conductivity, and the body region 26 is formed by, for example, forming a photoresist layer 261 as a mask by a lithography process, and doping the second impurities into the well region 22 in the form of accelerated ions by an ion implantation process. The body region 26 contacts the well region 22 in the channel direction (shown by the lower dashed arrow in the figure), and the body region 26 has a third impurity concentration, wherein the third impurity concentration is higher than the first impurity concentration and the second impurity concentration.

Figure 10E:
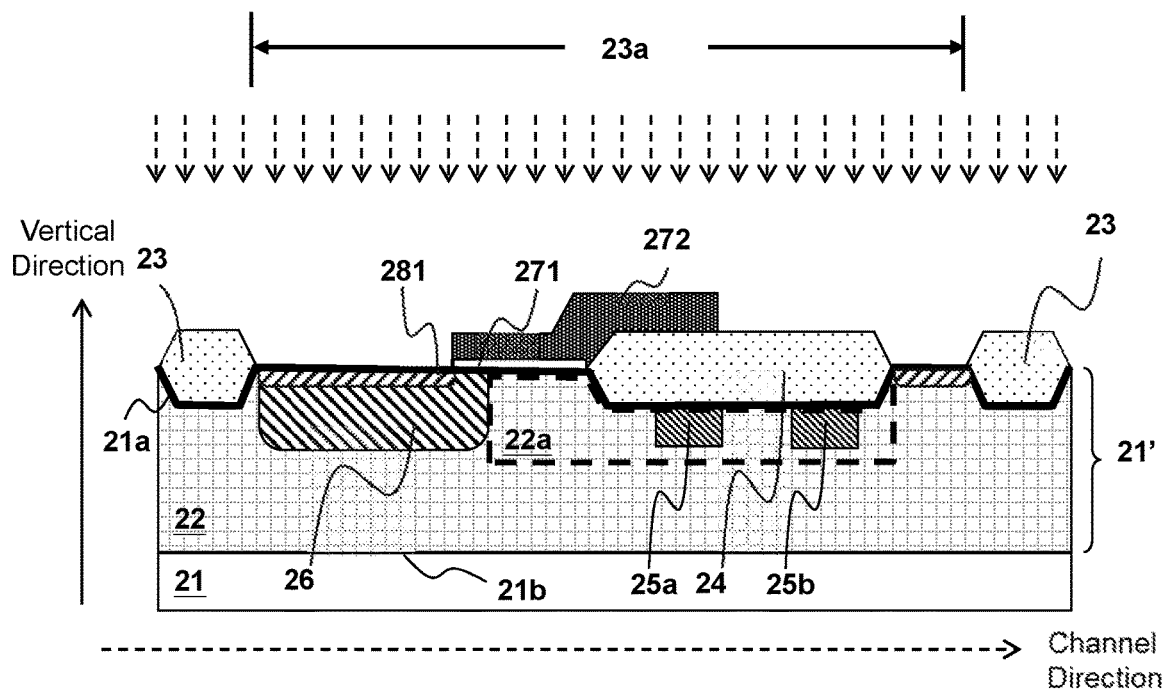

Next, please refer to FIG. 10E. A gate dielectric layer 271 and a gate conductive layer 272 of the gate 27 are formed on the top surface, in the operation region 23a of the semiconductor layer 21', wherein a portion of the body region 26 is located below the gate dielectric layer 271 and the conductive layer 272 of the gate 27 and in contact with the gate dielectric layer 271 in the vertical direction (as indicated by the direction of the solid arrow in FIG. 10E) to provide an inversion region of the high voltage device 200 during ON operation.

Still referring to FIG. 10E, in one embodiment, after the gate dielectric layer 271 and the conductive layer 272 of the gate 27 are formed, a lightly doped region 281 is formed in the body region 26, to assist forming an inverse current channel below a gate spacer layer 273 (to be formed later) during ON operation of the high voltage device 200. The lightly doped region 281 is formed by, for example, doping a first impurities into the body region 26 in the form of accelerated ions by an ion implantation process.

Figure 10F:
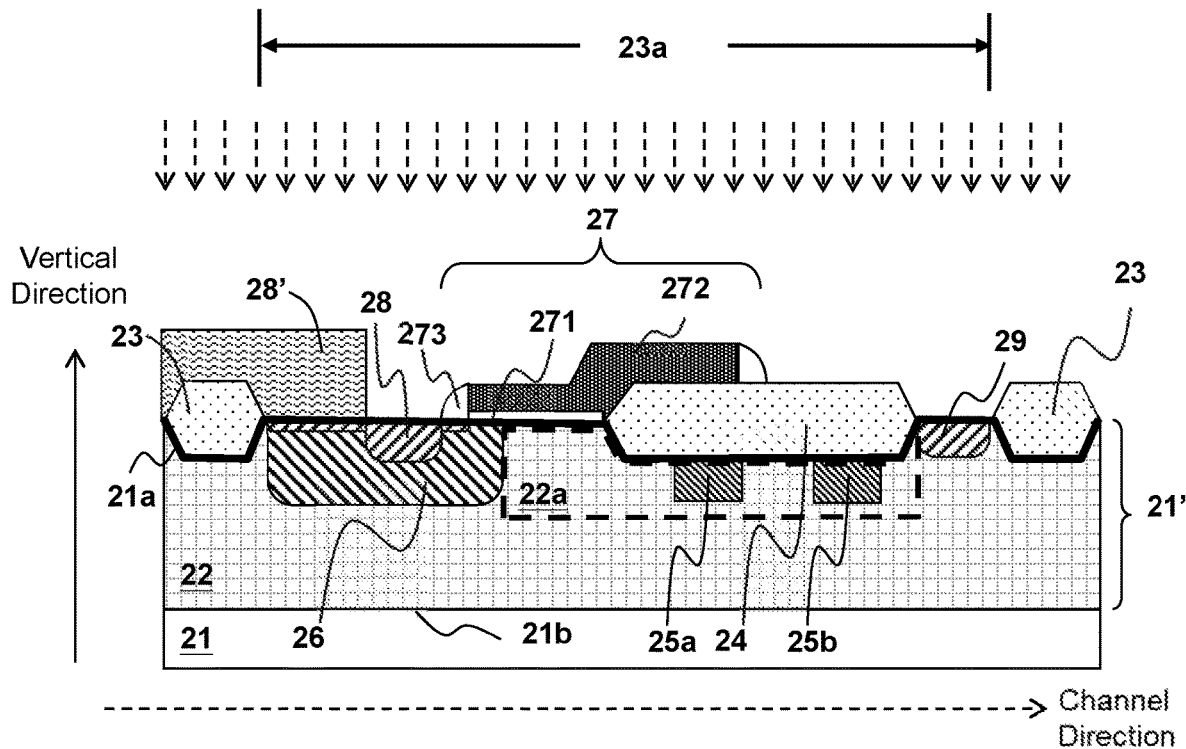

Next, please refer to FIG. 10F. A gate spacer layer 273 is formed outside of the sidewalls of the gate conductive layer 272. Next, the source 28 and the drain 29 are formed in the operation region 23a, beneath the top surface 21a and in contact with the top surface 21a. The source 28 and the drain 29 are respectively located at two lateral sides of the gate 27, wherein the source 28 is located in the body region 26, and the drain 29 is located in the well region 22 and away from the body region 26. In the channel direction, the drift region 22a is located between the drain 29 and the body region 26, in the well region 22 near the top surface 21a, to serve as a drift current channel of the high voltage device 200 during ON operation. The source 28 and the drain 29 are located beneath the top surface 21a and in contact with the top surface 21a in the vertical direction. The source 28 and the drain 29 have N-type conductivity, which are formed by, for example, forming a photoresist layer 28' by a lithography process, and doping a first impurities into the body region 26 and the well region 22, respectively, in the form of accelerated ions by an ion implantation process.

Figure 10G:
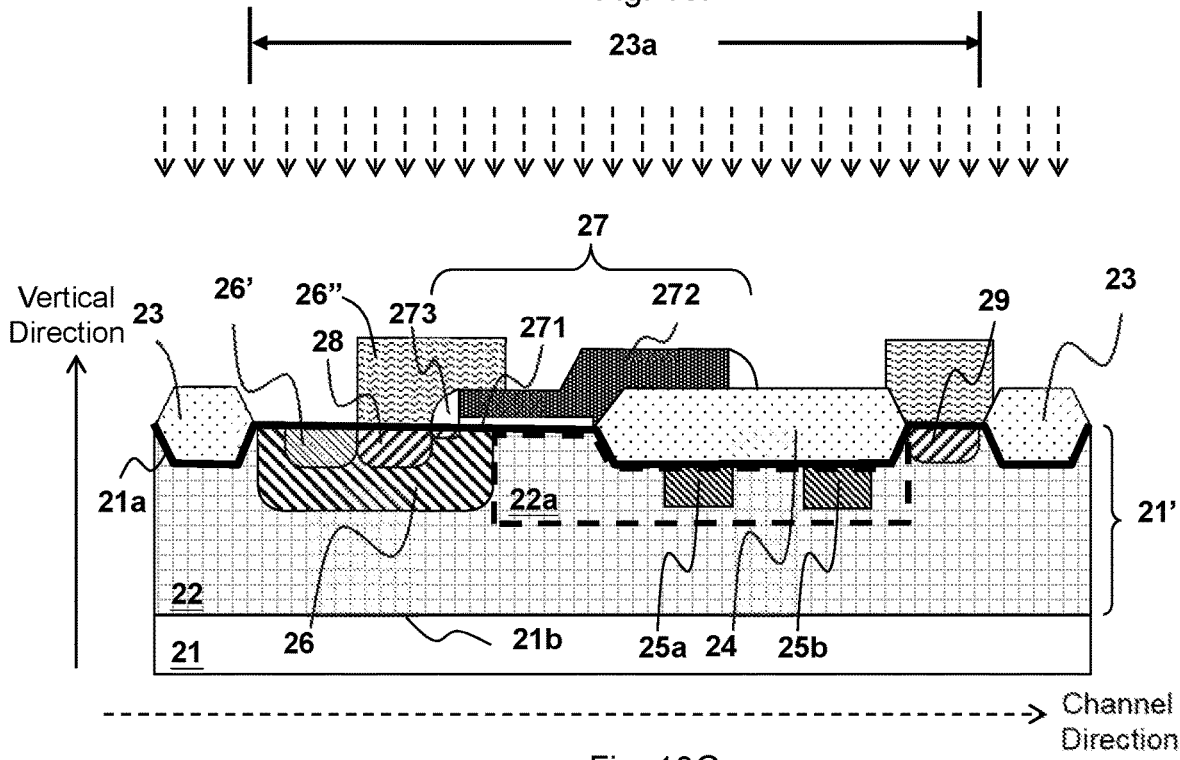

Next, as shown in FIG. 10G, a body electrode 26' is formed in the body region 26. The body electrode 26' which has P-type conductivity is provides as an electrical contact of the body region 26. The body electrode 26' is formed in the body region 26, beneath the top surface 21a and in contact with the top surface 21a in the vertical direction. The body electrode 26' is formed by, for example, forming a photoresist layer 26" as a mask by a lithography process, and doping a second impurities is into the body region 26 in the form of accelerated ions by an ion implantation process.

Figure 10H:
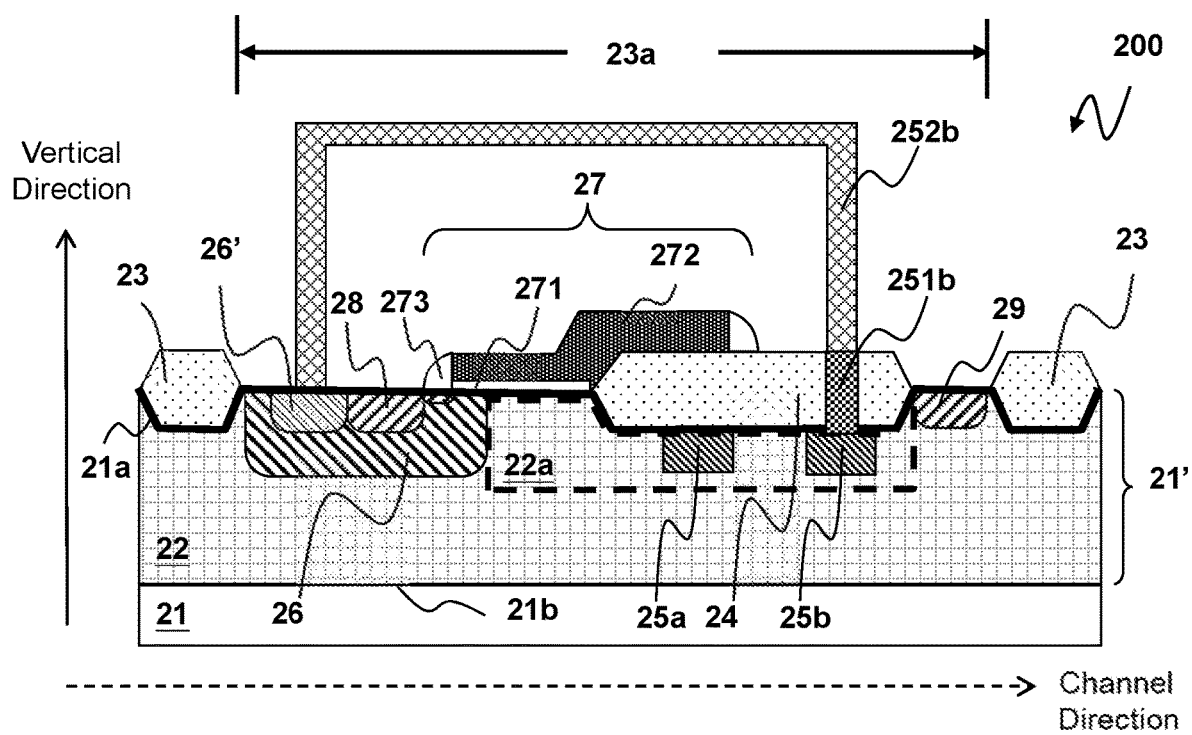

Next, as shown in FIG. 10H, a conductive plug 251b and a wire 252b are formed, wherein the conductive plug 251b is electrically connected with the bias region 25b, by penetrating through the drift oxide region 24 in the vertical direction, to serve as an electrical contact of the bias region 25b. The conductive plug 251b is electrically connected to the body electrode 26' via the wire 752b, so that the bias region 25b is electrically connected with the body electrode 26'.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography technique is not limited to the mask technology but it can be electron beam lithography, immersion lithography, etc. Therefore, in the same spirit of the present invention, those skilled in the art can think of various equivalent variations and modifications, which should fall in the scope of the claims and the equivalents.

What is claimed is:

1. A high voltage device comprising:
   a semiconductor layer formed on a substrate, wherein the semiconductor layer has a top surface and a bottom surface opposite to the top surface in a vertical direction;
   a well region having a first conductivity, wherein the well region is formed beneath the top surface and in contact with the top surface;
   a floating region having a second conductivity, wherein the floating region is formed in the well region, beneath the top surface and in contact with in the top surface, the floating region having a first impurity concentration;
   a bias region having the second conductivity, wherein the bias region is formed in the well region, beneath the top surface and in contact with the top surface, the bias region having a second impurity concentration;
   a body region having the second conductivity, wherein the body region is formed beneath and in contact with the top surface and contacts the well region in a channel direction, the body region having a third impurity concentration, wherein the third impurity concentration is higher than the first impurity concentration and the second impurity concentration;
   a body electrode having the second conductivity, wherein the body electrode is formed in the body region, beneath the top surface and in contact with the top surface, to serve as an electrical contact of the body region;
   a gate formed on the top substrate, wherein a portion of the body region is located below the gate and in contact with the gate, to provide an inversion region of the high voltage device during ON operation of the high voltage device; and
   a source and a drain having the first conductivity, the source and the drain being formed beneath the top surface and in contact with the top surface in the vertical direction, wherein the source and the drain are respectively located at two lateral sides of the gate, the source being located in the body region, and the drain being located in the well region and away from the body region;
   wherein a portion of the well region between the body region and the drain serves as a drift region during ON operation of the high voltage device;
   wherein the floating region and the bias region are both in the drift region;
   wherein the bias region is electrically connected with a predetermined bias voltage and the floating region is electrically floating.

2. The high voltage device of claim 1, further including a drift oxide region formed on the top surface and in contact with a portion of the drift region, wherein the floating region and the bias region are located below the drift oxide region and in contact with the drift oxide region.

3. The high voltage device of claim 2, wherein the drift oxide region includes a local oxidation of silicon (LOCOS) structure, a shallow trench isolation (STI) structure or a chemical vapor deposition (CVD) oxide structure.

4. The high voltage device of claim 2, further including a conductive plug which is electrically connected with the bias region by penetrating through the drift oxide region in the vertical direction, to serve as an electrical contact of the bias region.

5. The high voltage device of claim 1, wherein a portion of the gate is located on the floating region or on the bias region.

6. The high voltage device of claim 1, wherein the bias region is electrically connected to the body electrode.

7. The high voltage device of claim 1, wherein the floating region and the bias region are not in contact with each other, and the floating region and the bias region are separated by the well region in the channel direction.

8. The high voltage device of claim 1, further including a buried layer having the first conductivity, wherein the buried layer is formed beneath the body region and in contact with the body region and the buried layer completely covers a lower boundary of the body region.

9. A manufacturing method of a high voltage device, comprising:

forming a semiconductor layer on a substrate, wherein the semiconductor layer has a top surface and a bottom surface opposite to the top surface in a vertical direction;

forming a well region having a first conductivity, wherein the well region is formed beneath the top surface and in contact with the top surface;

forming a floating region having a second conductivity, wherein the floating region is formed in the well region, beneath the top surface and in contact with in the top surface, the floating region having a first impurity concentration;

forming a bias region having the second conductivity, wherein the bias region is formed in the well region, beneath the top surface and in contact with the top surface, the bias region having a second impurity concentration;

forming a body region having the second conductivity, wherein the body region is formed beneath and in contact with the top surface and contacts the well region in a channel direction, the body region having a third impurity concentration, wherein the third impurity concentration is higher than the first impurity concentration and the second impurity concentration;

forming a body electrode having the second conductivity, wherein the body electrode is formed in the body region, beneath the top surface and in contact with the top surface, to serve as an electrical contact of the body region;

forming a gate formed on the top substrate, wherein a portion of the body region is located below the gate and in contact with the gate, to provide an inversion region of the high voltage device during ON operation of the high voltage device; and forming a source and a drain having the first conductivity, the source and the drain being formed beneath the top surface and in contact with the top surface in the vertical direction, wherein the source and the drain are respectively located at two lateral sides of the gate, the source being located in the body region, and the drain being located in the well region and away from the body region;

wherein a portion of the well region between the body region and the drain serves as a drift region during ON operation of the high voltage device;

wherein the floating region and the bias region are both in the drift region;

wherein the bias region is electrically connected with a predetermined bias voltage and the floating region is electrically floating.

10. The manufacturing method of the high voltage device claim 9, further including: forming a drift oxide region on the top surface and in contact with a portion of the drift region, wherein the floating region and the bias region are located below the drift oxide region and in contact with the drift oxide region.

11. The manufacturing method of the high voltage device claim 10, wherein the drift oxide region includes a local oxidation of silicon (LOCOS) structure, a shallow trench isolation (STI) structure or a chemical vapor deposition (CVD) oxide structure.

12. The manufacturing method of the high voltage device claim 10, further including: forming a conductive plug which is electrically connected with the bias region and which penetrates through the drift oxide region in the vertical direction, to serve as an electrical contact of the bias region.

13. The manufacturing method of the high voltage device claim 9, wherein a portion of the gate is located on the floating region or on the bias region.

14. The manufacturing method of the high voltage device claim 9, wherein the bias region is electrically connected to the body electrode.

15. The manufacturing method of the high voltage device claim 9, wherein the floating region and the bias region are not in contact with each other, and the floating region and the bias region are separated by the well region in the channel direction.

16. The manufacturing method of the high voltage device claim 9, further including: forming a buried layer having the first conductivity, wherein the buried layer is formed beneath the body region and in contact with the body region and the buried layer completely covers a lower boundary of the body region.

* * * * *